(12) United States Patent
Kwon et al.

(10) Patent No.: US 12,512,369 B2
(45) Date of Patent: Dec. 30, 2025

(54) WAFER DICING METHOD AND METHOD OF MANUFACTURING SEMICONDUCTOR DEVICES BY USING THE WAFER DICING METHOD

(71) Applicant: SAMSUNG ELECTRONICS CO., LTD., Suwon-si (KR)

(72) Inventors: Youngchul Kwon, Suwon-si (KR); Deoksuk Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 385 days.

(21) Appl. No.: 18/341,406

(22) Filed: Jun. 26, 2023

(65) Prior Publication Data

US 2024/0096703 A1    Mar. 21, 2024

(30) Foreign Application Priority Data

Sep. 19, 2022    (KR) .................... 10-2022-0118159

(51) Int. Cl.
*H01L 21/78*     (2006.01)
*B23K 26/06*     (2014.01)
*B23K 26/0622*   (2014.01)
*B23K 26/53*     (2014.01)
*B23K 103/00*    (2006.01)

(52) U.S. Cl.
CPC .......... *H01L 21/78* (2013.01); *B23K 26/0608* (2013.01); *B23K 26/0622* (2015.10); *B23K 26/53* (2015.10); *B23K 2103/56* (2018.08)

(58) Field of Classification Search
CPC ....... H01L 21/304; H01L 21/78; B23K 26/00; B23K 26/0006; B23K 26/06; B23K 26/0608; B23K 26/0613; B23K 26/0619; B23K 26/0622; B23K 26/067; B23K 26/08; B23K 26/082; B23K 26/083; B23K 26/32; B23K 26/40; B23K 26/53; B23K 101/40; B23K 103/00; B23K 2101/40; B23K 2103/52; B23K 2103/56
See application file for complete search history.

(56) References Cited

U.S. PATENT DOCUMENTS

| | | |
|---|---|---|
| 8,598,490 B2 | 12/2013 | Hooper et al. |
| 2005/0067388 A1 | 3/2005 | Sun et al. |
| 2011/0174787 A1 | 7/2011 | Ide et al. |
| 2012/0264238 A1 | 10/2012 | Boyle et al. |
| 2013/0026153 A1 | 1/2013 | Ide et al. |

(Continued)

FOREIGN PATENT DOCUMENTS

KR    10-1379411    3/2014

*Primary Examiner* — Brook Kebede
(74) *Attorney, Agent, or Firm* — Morgan, Lewis & Bockius LLP

(57) ABSTRACT

A wafer dicing method includes preparing a wafer that includes a plurality of device forming regions and a scribe lane region that separates the plurality of device forming regions, forming a plurality of semiconductor devices in the plurality of device forming regions of the wafer, respectively, forming a plurality of inner cracks in the scribe lane region of the wafer by repeatedly irradiating a multiple pulse laser beam that includes a plurality of sub-laser beams along the scribe lane region, wherein the plurality of sub-laser beams have decreasing peak powers, and separating the plurality of semiconductor devices from each other along the plurality of inner cracks.

20 Claims, 26 Drawing Sheets

(56) References Cited

U.S. PATENT DOCUMENTS

2020/0126800 A1     4/2020   Vazquez-Cordova et al.
2020/0298346 A1*    9/2020   Kwon ..................... H01L 21/78
2021/0354247 A1*   11/2021   Kwon ................... H01S 3/2316

* cited by examiner

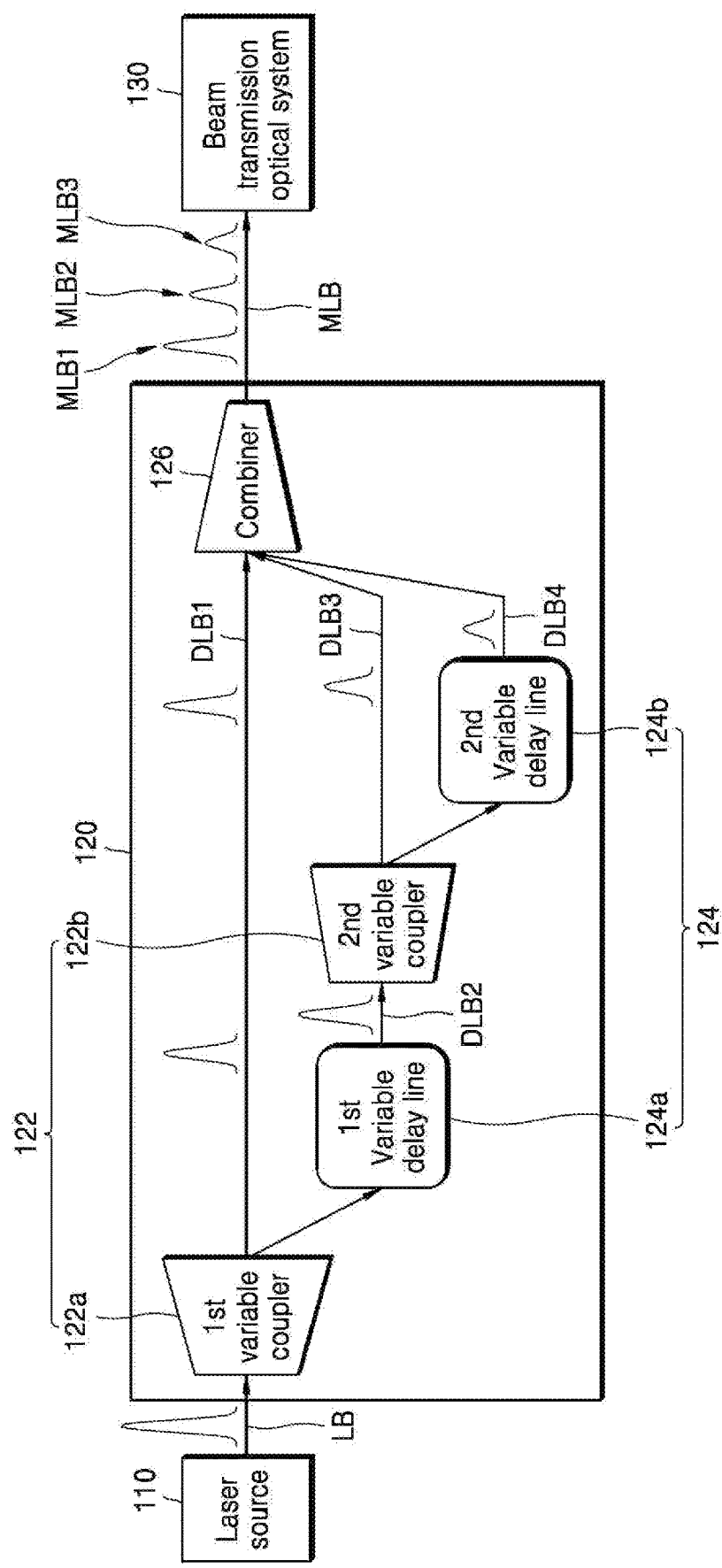

WAFER DICING METHOD AND METHOD OF MANUFACTURING SEMICONDUCTOR DEVICES BY USING THE WAFER DICING METHOD

CROSS-REFERENCE TO RELATED APPLICATION

This application claims priority under 35 U.S.C. § 119 from Korean Patent Application No. 10-2022-0118159, filed on Sep. 19, 2022 in the Korean Intellectual Property Office, the contents of which are herein incorporated by reference in their entirety.

TECHNICAL FIELD

Embodiments of the inventive concept are directed to a wafer dicing method and a method of manufacturing a semiconductor device by using the wafer dicing method, and more particularly, to a wafer dicing method that includes a stealth dicing process and a method of a semiconductor device by using the wafer dicing method.

DISCUSSION OF THE RELATED ART

A laser processing process processes a workpiece with respect to the shape or physical properties of a surface of the workpiece by scanning laser beams to the surface of the workpiece. The laser processing may include, for example, a patterning process that forms a pattern on the surface of the workpiece, a process, such as a wafer annealing process, that modifies the physical properties of the workpiece, a molding process that changes the shape of the workpiece by using a thermal reflow process, and a cutting process that cuts the workpiece into a plurality of units by using a thermal reflow process.

In a common wafer dicing process that uses laser beams, a workpiece can be thermally reflowed by irradiating laser light in a wavelength band having a high absorptance to the workpiece to cut the workpiece. When a wafer is reflowed and cut, not only cut areas but also surrounding areas thereof are also reflowed, and thus, a semiconductor device formed on the wafer may be partially damaged.

SUMMARY

Embodiments of the inventive concept provide a wafer dicing method with increased reliability and a method of manufacturing a semiconductor device by using the wafer dicing method.

According to an embodiment of the inventive concept, there is provided a wafer dicing method. The method includes preparing a wafer that includes a plurality of device forming regions and a scribe lane region that separates the plurality of device forming regions, forming a plurality of semiconductor devices in the plurality of device forming regions of the wafer, respectively, forming a plurality of inner cracks in the scribe lane region of the wafer by repeatedly irradiating a multiple pulse laser beam that includes a plurality of sub-laser beams along the scribe lane region, where the plurality of sub-laser beams have decreasing peak powers, and separating the plurality of semiconductor devices from each other along the plurality of inner cracks.

According to an embodiment of the inventive concept, there is provided a method of manufacturing a semiconductor device. The method includes preparing a wafer that includes a plurality of device forming regions and a scribe lane region that separates the plurality of device forming regions, forming a plurality of semiconductor devices in the plurality of device forming regions of the wafer, respectively, forming a plurality of inner cracks by repeatedly irradiating a multiple pulse laser beam that includes a plurality of sub-laser beams at intervals of about 10 μs to about 30 μs, where the plurality of inner cracks have decreasing peak powers and an arrival time interval of about 0.3 μs to about 2 μs therebetween, and the plurality of inner cracks are spaced apart from each other in a lateral direction in the wafer, separating the plurality of semiconductor devices from each other along the plurality of inner cracks, and packaging each of the plurality of semiconductor devices, which are separated from each other.

According to an embodiment of the inventive concept, there is provided a method of manufacturing a semiconductor device. The method includes preparing a wafer that includes a plurality of device forming regions and a scribe lane region that separates the plurality of device forming regions, forming a plurality of semiconductor devices in the plurality of device forming regions of the wafer, respectively, forming a first inner crack, a second inner crack, and a third inner crack by repeatedly irradiating a multiple pulse laser beam that includes a first sub-laser beam, a second sub-laser beam, and a third sub-laser beam at a pulse pitch greater than an arrival time interval between the first to third sub-laser beams, where the first to third sub-laser beams have the arrival time interval therebetween and have decreasing peak powers, and the first inner crack, the second inner crack, and the third inner crack are spaced apart from each other in a lateral direction in the wafer, separating the plurality of semiconductor devices from each other along the first inner crack, the second inner crack, and the third inner crack, and packaging each of the plurality of semiconductor devices, which are separated from each other. The second sub-laser beam is focused and irradiated on a second beam focal point, where the second beam focal point is located in a first parallel heat conduction region in which parallel heat conduction occurs around a first beam focal point due to the first sub-laser beam, and the third sub-laser beam is focused and irradiated on a third beam focal point, where the third beam focal point is located in a second parallel heat conductive region in which parallel heat conduction occurs around the second beam focal point due to the second sub-laser beam.

BRIEF DESCRIPTION OF THE DRAWINGS

FIGS. 1A and 1B are block diagrams of a wafer processing device that performs a wafer dicing process, according to embodiments.

DETAILED DESCRIPTION OF THE EMBODIMENTS

Figure 1A:
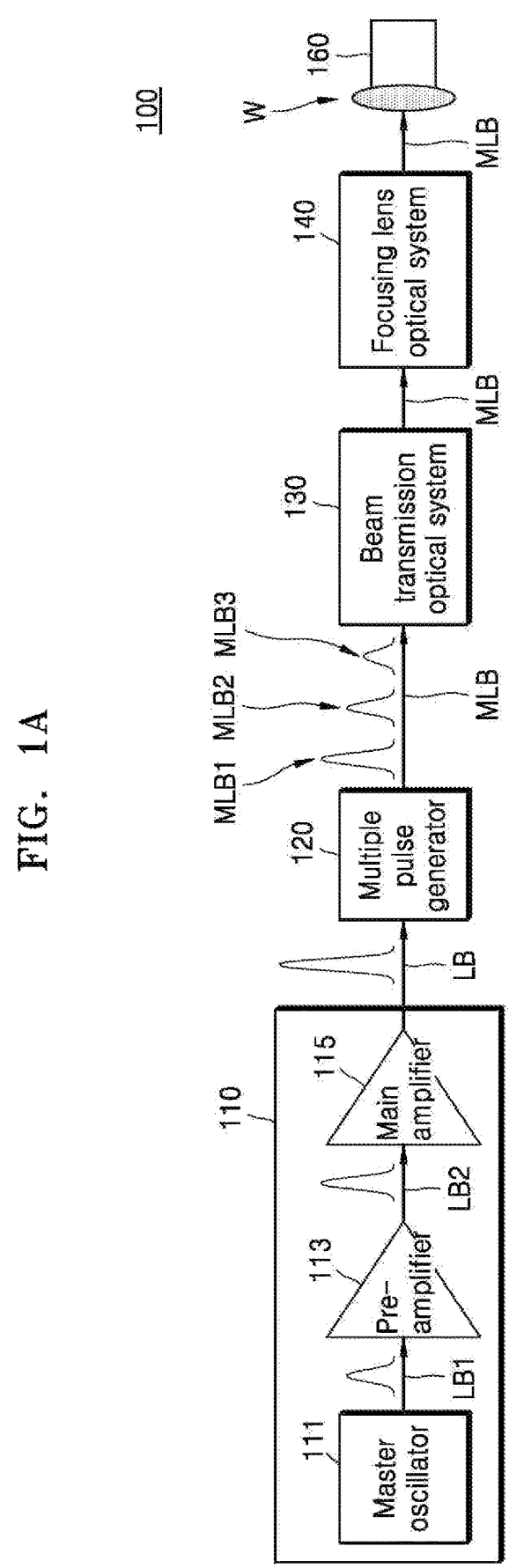

FIGS. 1A and 1B are block diagrams of a wafer processing device 100 that performs a wafer dicing process, according to embodiments.

Referring to FIGS. 1A and 1B, in an embodiment, the wafer processing device 100 includes a laser source 110, a multiple pulse generator 120, a beam transmission optical system 130, a focusing lens optical system 140, and a wafer support 160.

The wafer processing device 100 performs a wafer dicing process. In some embodiments, the wafer processing device 100 performs a stealth dicing process. The stealth dicing process separates a wafer W on which a semiconductor device is formed, with high precision at high speed. The stealth dicing process focuses a laser beam having a wavelength band in which the wafer W has a low absorptance to a point inside the wafer W through a surface of the wafer W.

In a stealth dicing technique, the laser beam repeatedly irradiates the wafer with pulses lasting for a very short time of, for example, about 1 μs or less, and is focused in a narrow area on the wafer W. For example, near a focal point inside the wafer W, the laser beam spatially (through focusing) and temporally (through pulsing) has a high peak power density of, for example, about $1 \times 10^8$ [W/cm$^2$]. A laser beam that has a high peak power density produces a nonlinear absorption effect on the wafer W near the focal point. Accordingly, a laser beam propagating through the wafer W is absorbed with a high absorptance near the focal point inside the wafer W. Therefore, the laser beam phase-changes in a portion of the wafer W that has absorbed the laser beam and can cause high-density defects, such as dislocations, and can facilitate the formation of a vertical crack in the wafer W.

In some embodiments, the laser source 110 includes a master oscillator and power amplifier (hereinafter, MOPA) laser. The laser source 110 is an optical fiber laser. The laser source 110 includes a master oscillator 111, a pre-amplifier 113, and a main amplifier 115 that, are coupled to each other through optical fibers. However, embodiments of the inventive concept are not necessarily limited thereto, and in other embodiments, the laser source 110 includes a MOPA laser that includes a solid bulk laser and a bulk amplifier, or a MOPA laser that includes a tunable external cavity diode laser and a semiconductor optical amplifier.

In some embodiments, the master oscillator 111 includes an optical fiber laser doped with one of ytterbium (Yb), erbium (Er), thulium (Tm), or holmium (Ho). In some embodiments, the master oscillator 111 generated a first laser beam LB1 that has a wavelength of about 0.8 μm to about 1.4 μm. In some embodiments, each of the first laser beam LB1, a second laser beam LB2, and a laser beam LB has a wavelength of about 1064 μm.

In some embodiments, the master oscillator 111 operates in a Q-switching mode. The laser source 110 generates the first laser beam LB1 with a pulse frequency of several hundreds of kHz. However, embodiments of the inventive concept are not necessarily limited thereto, and in some embodiments, the master oscillator 111 operates in a mode-locking mode.

The master oscillator 111 included a seed laser diode, an optical fiber that includes a gain medium, and first and second mirrors that face each other to resonate the first laser beam LB1. The seed laser diode generates laser beams by using a forward semiconductor junction as an active medium. When current is supplied to the seed laser diode, light is emitted when a high energy level density and a low energy level density reverses at a semiconductor junction.

Light emitted by the seed laser diode is used as pumping energy for the optical fiber. When a plurality of the seed laser diodes are provided, a pump-signal combining device is provided between the plurality of seed laser diodes and the optical fiber. The pump-signal combining device combines optical signals output by the plurality of seed laser diodes into one optical signal and transmits the combined optical signal to the optical fiber.

Most of the light emitted spontaneously or stimulated from the gain medium of the optical fiber has weak directionality. The first and second mirrors reflect the light emitted from the gain medium back into the gain medium, and thus, a resonance occurs in which stimulated emission of the gain medium is repeated. Some of light beams repeatedly reflected between the first and second mirrors pass through the second mirror and are output as the first laser beam LB1. The first laser beam LB1 is coherent light.

The master oscillator 111 further includes an optical modulator that modulates an intensity-time profile of the first laser beam LB1. The optical modulator includes an aperture that can transmit or shield the first laser beam LB1, and modulates an intensity-time profile of a pulse of the first laser beam LB1 by adjusting a transmittance of the first laser beam LB1 that passes through the aperture.

The pre-amplifier 113 includes a first pump laser diode, and the main amplifier 115 includes a second pump laser diode. In some embodiments, the pre-amplifier 113 includes a plurality of the first pump laser diodes. In some embodiments, the main amplifier 115 includes a plurality of the second pump laser diodes.

The pre-amplifier 113 amplifies the first laser beam LB1 and output the second laser beam LB2. The second laser beam LB2 has the same wavelength as the first laser beam LB1. The main amplifier 115 amplifies the second laser beam LB2 and outputs the laser beam LB. The laser beam LB has the same wavelength as the second laser beam LB2.

The first laser beam LB1, the second laser beam LB2, and the laser beam LB each have the same intensity-time profile by adjusting an amplification ratio. For example, the first laser beam LB1, the second laser beam LB2, and the laser beam LB substantially have the same pulse width, kurtosis, and skewness as each other. However, embodiments of the inventive concept are not necessarily limited thereto, and in some embodiment, one of the first and second laser beams LB1 and LB2 has s different pulse width, kurtosis, and/or skewness from the laser beam LB.

The first pump laser diode in the pre-amplifier 113 generates a first pump laser beam. The second pump laser diode in the main amplifier 115 generates a second pump laser beam. The first pump laser beam merges into an optical path of the first laser beam LB1 by an optical combiner, and the second pump laser beam merges into an optical path of the second laser beam LB2 by the optical combiner. The first and second pump laser diodes are driven by a radio-frequency (RF) power.

In some embodiments, the first and second pump laser beams have different wavelengths from the first laser beam LB1. In some embodiments, the first and second pump laser beams have shorter wavelengths than the first laser beam LB1. In some embodiments, the first and second pump laser beams have wavelengths that have higher absorptances in the optical fiber than the laser beam LB. The first pump laser beam is absorbed by the optical fiber, and thus, the first laser beam LB1 is amplified and the second laser beam LB2 is output. The second pump laser beam is absorbed by the optical fiber, and thus, the second laser beam LB2 is amplified and the laser beam LB is output. However, embodiments of the inventive concept are not necessarily limited thereto, and in some embodiments, the first and second pump laser beams have the same wavelength as the first laser beam LB1.

In some embodiments, an isolator is provided between the master oscillator 111 and the pre-amplifier 113, and another isolator is provided between the pre-amplifier 113 and the main amplifier 115. An isolator may also be referred to as an optical diode and is an optical component that allows light to be transmitted in only one direction. The isolator prevents reverse propagation of the first laser beam LB and the second laser beam LB2.

In some embodiments, an additional pre-amplifier is further provided between the pre-amplifier 113 and the main amplifier 115, based on the intensity of the laser beam LB to be finally output by the laser source 110. For example, the laser source 110 includes at least two pre-amplifiers. In an embodiment, an isolator and a collimator are provided at an output terminal through which the laser beam LB is emitted from the laser source 110.

In some embodiments, an intensity-time profile (hereinafter, a time profile) of a single pulse (hereinafter, simply referred to as a single pulse) in the first laser beam LB1, the second laser beam LB2, and the laser beam LB has a Gaussian distribution. In some embodiments, the time profile of the single pulse differs from the Gaussian distribution. In some embodiments, the time profile of the single pulse differs from a Lorentzian distribution.

In some embodiments, a full width at half maximum (FWHM) of the single pulse is in a range of about 1 ps to about 1 µs. In some embodiments, the FWHM of the single pulse is about 500 ns or less.

In some embodiments, the time profile of the single pulse is symmetric about the center of the single pulse. The center of the pulse is a midpoint between a start point and an end point of the pulse. In some embodiments, the time profile of the single pulse is asymmetric about the center of the pulse. For example, in some embodiments, a time interval from a start point SP of the single pulse to a peak point PP of an intensity is less than a time interval from the peak point PP of the intensity to the end point EP of the single pulse. For example, in some embodiments, the time interval from the start point SP of the single pulse to the peak point PP of the intensity is greater than the time point from the peak point PP of the intensity to the end point EP of the single pulse.

In some embodiments, a rise time is about 1% or more and less than about 50% of the FWHM of the single pulse. The rise time is the time required for an intensity of the single pulse to increase from about 10% of the peak point PP to about 90% of the peak point PP.

In some embodiments, a peak power of a single pulse in the laser beam LB is in a range of about 1 W to about 1 kW.

In some embodiments, an average power of the single pulse is in a range of about 1 W to about 60 W.

The laser source 110 repeatedly outputs the laser beam LB at substantially constant time intervals. In some embodiments, the laser source 110 repeatedly outputs the laser beam LB at time intervals of several µs or more. For example, the laser source 110 repeatedly outputs the laser beam LB at intervals in a range of about 10 µs to about 30 µs.

The laser beam LB output by the laser source 110 propagates to the multiple pulse generator 120. The multiple pulse generator 120 divides and delays the laser beam LB, and generates a multiple pulse laser beam MLB. The multiple pulse laser beam MLB includes a plurality of sub-laser beams MLB1, MLB2, and MLB3. The multiple pulse generator 120 receives the laser beam LB that is repeatedly output by the laser source 110 at substantially constant time intervals and repeatedly generates the multiple pulse laser beam MLB that includes the plurality of sub-laser beams MLB1, MLB2, and MLB3. The multiple pulse generator 120 repeatedly generates the multiple pulse laser beam MLB at time intervals of several µs or more. For example, the multiple pulse generator 120 repeatedly generates the multiple pulse laser beam MLB at intervals of about 10 µs to about 30 µs and outputs the multiple pulse laser beam MLB to the beam transmission optical system 130. Although FIG. 1A shows the multiple pulse laser beam MLB as including three sub-laser beams MLB1, MLB2, and MLB3, embodiments are not necessarily limited thereto, and in some embodiments, the multiple pulse laser beam MLB includes two sub-laser beams or four or more sub-laser beams.

A time profile of each of the plurality of sub-laser beams MLB1, MLB2, and MLB3 has a similar shape to a time profile of the laser beam LB, while a peak power of each of the plurality of sub-laser beams MLB1, MLB2, and MLB3 is less than a peak power of the laser beam LB. The time profiles of the plurality of sub-laser beams MLB1, MLB2, and MLB3 have similar shapes to each other but have different peak powers from each other.

The plurality of sub-laser beams MLB1, MLB2, and MLB3 include a first sub-laser beam MLB1, a second sub-laser beam MLB2, and a third sub-laser beam MLB3.

The first to third sub-laser beams MLB1, MLB2, and MLB3 in the multiple pulse laser beam MLB have substantially similar time profiles and sequentially reduced peak powers. For example, the first sub-laser beam MLB1, the second sub-laser beam MLB2, and the third sub-laser beam MLB3 have similarly shaped time profiles. For example, a peak power of the first sub-laser beam MLB1 is greater than a peak power of each of the second sub-laser beam MLB2 and the third sub-laser beam MLB3, and the peak power of the second sub-laser beam MLB2 is less than the peak power of the first sub-laser beam MLB1 and greater than the peak power of the third sub-laser beam MLB3. The peak power of the third sub-laser beam MLB3 is less than the peak power of each of the first sub-laser beam MLB1 and the second sub-laser beam MLB2.

In some embodiments, arrival time intervals between the first to third sub-laser beams MLB1, MLB2, and MLB3 in the multiple pulse laser beam MLB are equal to each other. In some embodiments, an arrival time interval between the first sub-laser beam MLB1 and the second sub-laser beam MLB2 is equal to an arrival time interval between the second sub-laser beam MLB2 and the third sub-laser beam MLB3. In some embodiments, the arrival time intervals between the first to third sub-laser beams MLB1, MLB2, and MLB3 in the multiple pulse laser beam MLB are gradually reduced. In some embodiments, the arrival time interval between the second sub-laser beam MLB2 and the third sub-laser beam MLB3 is less than the arrival time interval between the first sub-laser beam MLB1 and the second sub-laser beam MLB2.

An arrival time interval is an interval between time points at which two sub-laser beams propagate to or arrive at the same position. For example, the arrival time interval is an interval between time points at which two sub-laser beams are received by the beam transmission optical system 130 or the focusing lens optical system 140. The arrival time interval between the first sub-laser beam MLB1 and the second sub-laser beam MLB2 is an interval between a time point at which the first sub-laser beam MLB1 arrives at the beam transmission optical system 130 or the focusing lens optical system 140 and a time point at which the second sub-laser beam MLB2 arrives at the beam transmission optical system 130 or the focusing lens optical system 140. The arrival time interval between the second sub-laser beam MLB2 and the third sub-laser beam MLB2 is an interval between the time point at which the second sub-laser beam MLB2 arrives at the beam transmission optical system 130 or the focusing lens optical system 140 and a time point at which the third sub-laser beam MLB3 arrives at the beam transmission optical system 130 or the focusing lens optical system 140.

The multiple pulse generator 120 includes at least one variable coupler 122, at least one variable delay line 124, and a combiner 126. The at least one variable coupler 122 divides the laser beam LB into at least two divided laser beams. The at least one variable coupler 122 includes one input optical fiber and at least two output optical fibers connected to the one input optical fiber.

For example, the laser beam LB transmitted through the one input optical fiber is divided into a first divided laser beam DLB1 and a second divided laser beam DLB2 and respectively transmitted to the two output optical fibers. The at least one variable delay line 124 is connected to one of the two output optical fibers connected to the at least one variable coupler 122, such as the output optical fiber to which the second divided laser beam DLB2 is transmitted. The at least one variable delay line 124 delays the second divided laser beam DLB2 with respect to the first divided laser beam DLB1 to have an arrival time interval. For example, the at least one variable delay line 124 delays the second divided laser beam DLB2 with respect to the first divided laser beam DLB1 to have an arrival time interval of about 2 µs or less. In some embodiments, the at least one variable delay line 124 delays the second divided laser beam DLB2 with respect to the first divided laser beam DLB1 to have an arrival time interval of about 300 ns to about 2 µs.

In some embodiments, the multiple pulse generator 120 includes at least one variable coupler 122, at least one variable delay line 124, and a combiner 126. The at least one variable coupler 122 includes a first variable coupler 122a and a second variable coupler 122b. The at least one variable delay line 124 includes a first variable delay line 124a and a second variable delay line 124b.

The first variable coupler 122a divides the laser beam LB into the first divided laser beam DLB1 and the second divided laser beam DLB2, and the second variable coupler 122b divide the second divided laser beam DLB2, which is delayed through the first variable delay line 124a, into a third divided laser beam DLB3 and a fourth divided laser beam DLB4. The second variable delay line 124b delays the fourth divided laser beam DLB4 with respect to the third divided laser beam DLB3 to have an arrival time interval.

At least two divided laser beams that have an arrival time interval therebetween are combined by the combiner 126 into the multiple pulse laser beam MLB.

For example, the first divided laser beam DLB1, the third divided laser beam DLB3, and the fourth divided laser beam DLB4, which are separated from each other and delayed through the at least one variable coupler 122 and the at least one variable delay line 124, are combined by the combiner 126 to generate the multiple pulse laser beam MLB that includes the first to third sub-laser beams MLB1, MLB2, and MLB3. The first divided laser beam DLB1, the third divided laser beam DLB3, and the fourth divided laser beam DLB4 respectively correspond to the first sub-laser beam MLB1, the second sub-laser beam MLB2, and the third sub-laser beam MLB3 in the multiple pulse laser beam MLB.

The multiple pulse laser beam MLB generated by the multiple pulse generator 120 is transmitted to the focusing lens optical system 140 by the beam transmission optical system 130. The beam transmission optical system 130 includes free space optics, without necessarily being limited thereto. The beam transmission optical system 130 includes various optical elements, such as a deflector, a lens, a reflex mirror, a prism, and/or a splitter.

The focusing lens optical system 140 focuses the multiple pulse laser beam MLB onto a set position inside the wafer W. For example, the focusing lens optical system 140 focuses each of the first to third sub-laser beams MLB1, MLB2, and MLB3 in the multiple pulse laser beam MLB onto a set position inside the wafer W. The focusing lens optical system 140 may include a single lens or a plurality of lenses.

The wafer support 160 supports the wafer W while the wafer W is being processed.

FIGS. 2A to 2D illustrate a multiple pulse laser beam output by a wafer processing device that performs a wafer dicing process, according to embodiments.

Figure 2A:
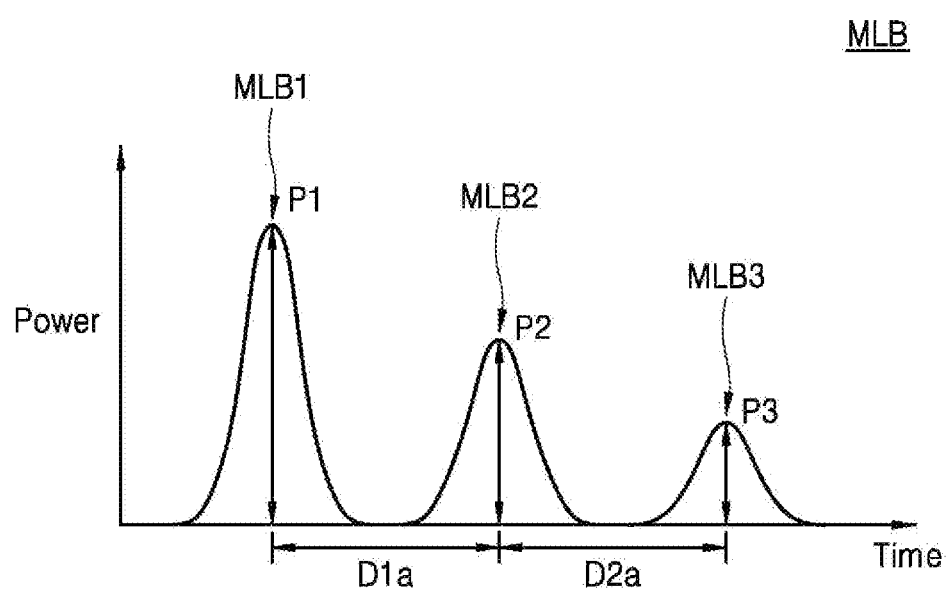
FIGS. 2A to 2D illustrate a multiple pulse laser beam output by a wafer processing device that performs a wafer dicing process, according to embodiments.

Referring to FIG. 2A, in an embodiment, a multiple pulse laser beam MLB includes a plurality of sub-laser beams MLB1, MLB2, and MLB3. The plurality of sub-laser beams MLB1, MLB2, and MLB3 have gradually reduced peak powers and are separated by constant time intervals. For example, the multiple pulse laser beam MLB includes a first sub-laser beam MLB1, a second sub-laser beam MLB2, and a third sub-laser beam MLB3. The first sub-laser beam MLB1 has a first peak power P1, the second sub-laser beam MLB2 has a second peak power P2, and the third sub-laser beam MLB3 has a third peak power P2. Each of the first peak power P1, the second peak power P2, and the third peak power P3 is less than a peak power of the laser beam LB shown in FIGS. 1A and 1B. The first peak power P1 is greater than the second peak power P2, and the second peak power P2 is greater than the third peak power P3. In some embodiments, the first peak power P1 is in a range of about 10 W to about 40 W. The second peak power P2 is about 50% to about 80% of the first peak power P1. The third peak power P3 is about 50% to about 80% of the second peak power P2. In some embodiments, a ratio of the second peak power P2 to the first peak power P1 is equal to a ratio of the third peak power P3 to the second peak power P2. In some other embodiments, the ratio of the third peak power P3 to the second peak power P2 is greater than the ratio of the second peak power P2 to the first peak power P1.

In some embodiments, a first arrival time interval D1a between the first sub-laser beam MLB1 and the second sub-laser beam MLB2 is equal to a second arrival time interval D2a between the second sub-laser beam MLB2 and the third sub-laser beam MLB3. For example, each of the first arrival time interval D1a and the second arrival time interval D2a is in a range of about 0.5 μs to about 2 μs.

Two adjacent sub-laser beams of the first to third sub-laser beams MLB1, MLB2, and MLB3 in the multiple pulse laser beam MLB separated from each other. For example, the first sub-laser beam MLB1 and the second sub-laser beam MLB2 are separated from each other and do not overlap each other, and the second sub-laser beam MLB2 and the third sub-laser beam MLB3 separated from each other and do not overlap each other. For example, a pulse width of the first sub-laser beam MLB1, the second sub-laser beam MLB2, and the third sub-laser beam MLB3 is less than each of the first arrival time interval D1a and the second arrival time interval D2a. Each of the first arrival time interval D1a and the second arrival time interval D2a is greater than the pulse width of each of each of the first sub-laser beam MLB1, the second sub-laser beam MLB2, and the third sub-laser beam MLB3, and less than or equal to five times the pulse width thereof.

Figure 2B:
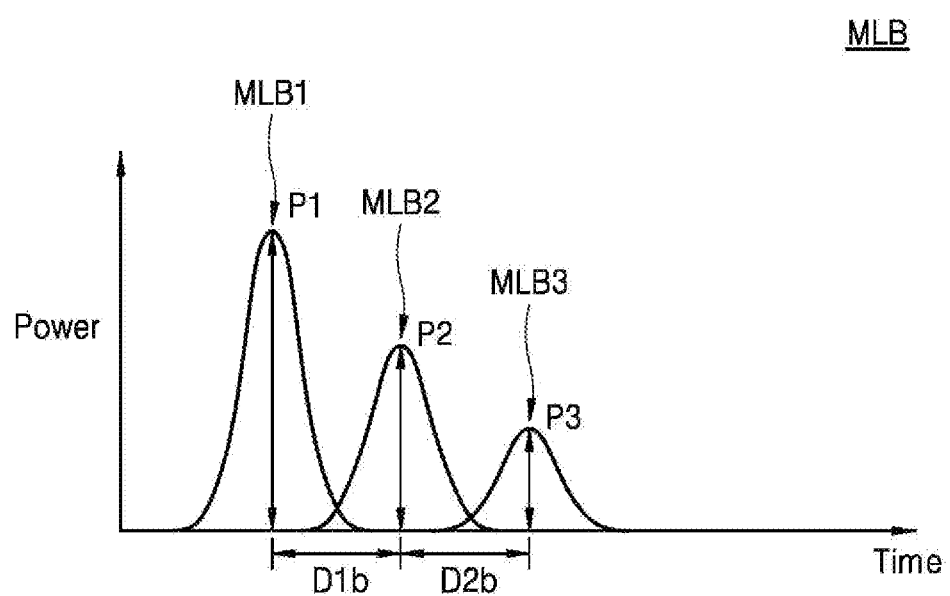

Referring to FIG. 2B, in an embodiment, a multiple pulse laser beam MLB includes a plurality of sub-laser beams MLB1, MLB2, and MLB3. The plurality of sub-laser beams MLB1, MLB2, and MLB3 have gradually reduced peak powers and are separated by constant time intervals. For example, the multiple pulse laser beam MLB includes a first sub-laser beam MLB1, a second sub-laser beam MLB2, and a third sub-laser beam MLB3. The first sub-laser beam MLB1 has a first peak power P1, the second sub-laser beam MLB2 has a second peak power P2, and the third sub-laser beam MLB3 has a third peak power P2. The first peak power P1 is greater than the second peak power P2, and the second peak power P2 is greater than the third peak power P3.

In some embodiments, a first arrival time interval D1b between the first sub-laser beam MLB1 and the second sub-laser beam MLB2 is equal to a second arrival time interval D2b between the second sub-laser beam MLB2 and the third sub-laser beam MLB3. For example, each of the first arrival time interval D1b and the second arrival time interval D2b is in a range of about 0.5 μs to about 1 μs.

Two adjacent sub-laser beams of the first to third sub-laser beams MLB1, MLB2, and MLB3 in the multiple pulse laser beam MLB partially overlap each other. For example, the first sub-laser beam MLB1 and the second sub-laser beam MLB2 partially overlap each other, and the second sub-laser beam MLB2 and the third sub-laser beam MLB3 partially overlap each other. For example, a pulse width of each of the first sub-laser beam MLB1, the second sub-laser beam MLB2, and the third sub-laser beam MLB3 is greater than each of the first arrival time interval D1b and the second arrival time interval D2b. Each of the first arrival time interval D1b and the second arrival time interval D2b is greater than the pulse width of each of the first sub-laser beam MLB1, the second sub-laser beam MLB2, and the third sub-laser beam MLB3 and less than or equal to five times the pulse width thereof.

Figure 2C:
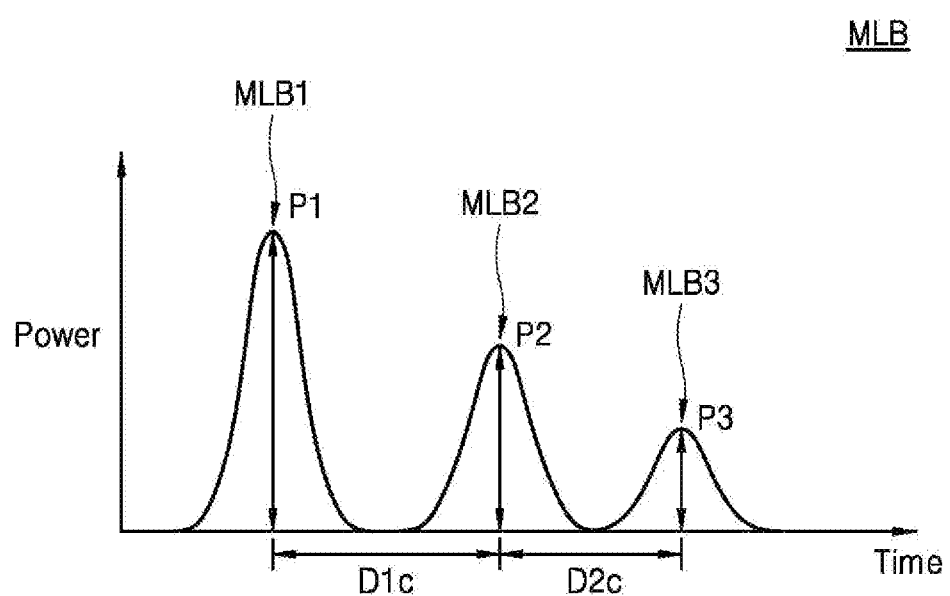

Referring to FIG. 2C, in an embodiment, a multiple pulse laser beam MLB includes a plurality of sub-laser beams MLB1, MLB2, and MLB3. The plurality of sub-laser beams MLB1, MLB2, and MLB3 have gradually reduced peak powers and are separated by gradually reduced time intervals. For example, the multiple pulse laser beam MLB includes a first sub-laser beam MLB1, a second sub-laser beam MLB2, and a third sub-laser beam MLB3. The first sub-laser beam MLB1 has a first peak power P1, the second sub-laser beam MLB2 has a second peak power P2, and the third sub-laser beam MLB3 has a third peak power P2. The first peak power P1 is greater than the second peak power P2, and the second peak power P2 is greater than the third peak power P3.

In some embodiments, a first arrival time interval D1c between the first sub-laser beam MLB1 and the second sub-laser beam MLB2 is greater than a second arrival time interval D2c between the second sub-laser beam MLB2 and the third sub-laser beam MLB3. For example, the first arrival time interval D1c is in a range of about 0.5 μs to about 2 μs, and the second arrival time interval D2c is in a range of about 0.3 μs to about 1.5 μs.

Two adjacent sub-laser beams of the first to third sub-laser beams MLB1, MLB2, and MLB3 in the multiple pulse laser beam MLB do not overlap each other. In some embodiments, the first sub-laser beam MLB1 and the second sub-laser beam MLB2 are separated from each other and do not overlap each other, and the second sub-laser beam MLB2 and the third sub-laser beam MLB3 are separated from each other and do not overlap each other. For example, the pulse width of each of the first sub-laser beam MLB1, the second sub-laser beam MLB2, and the third sub-laser beam MLB3 is less than each of the first arrival time interval D1c and the second arrival time interval D2c. In some other embodiments, the first sub-laser beam MLB1 and the second sub-laser beam MLB2 are separated from each other and do not overlap each other, and the second sub-laser beam MLB2 and the third sub-laser beam MLB3 separated from each other and do not overlap each other. For example, the pulse width of each of the first sub-laser beam MLB1, the second sub-laser beam MLB2, and the third sub-laser beam MLB3 is less than the first arrival time interval D1c and less than or equal to the second arrival time interval D2c.

Figure 2D:
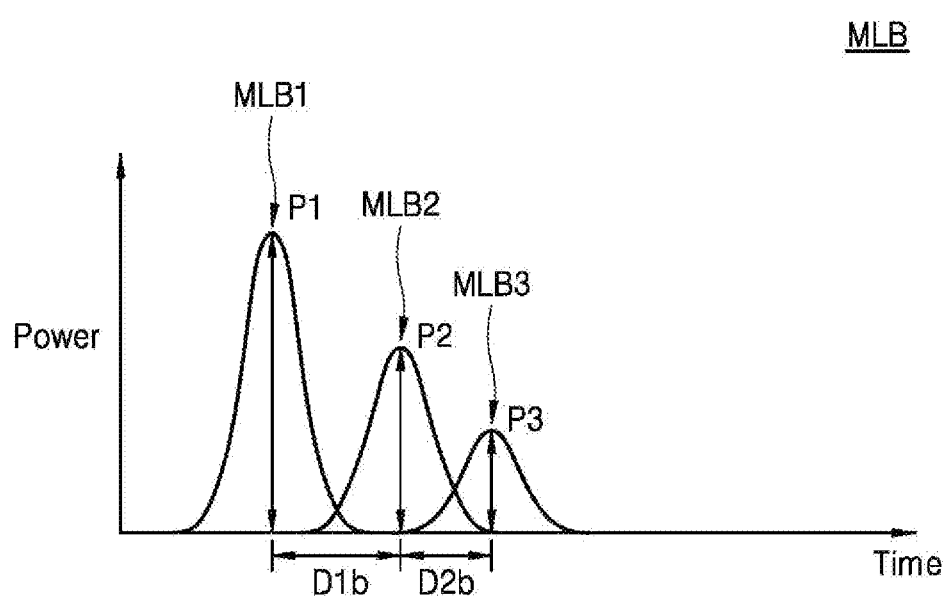

Referring to FIG. 2D, in an embodiment, a multiple pulse laser beam MLB includes a plurality of sub-laser beams MLB1, MLB2, and MLB3. The plurality of sub-laser beams MLB1, MLB2, and MLB3 have gradually reduced peak powers and are separated by gradually reduced time intervals. For example, the multiple pulse laser beam MLB includes a first sub-laser beam MLB1, a second sub-laser beam MLB2, and a third sub-laser beam MLB3. The first sub-laser beam MLB1 has a first peak power P1, the second sub-laser beam MLB2 has a second peak power P2, and the third sub-laser beam MLB3 has a third peak power P2. The first peak power P1 is greater than the second peak power P2, and the second peak power P2 is greater than the third peak power P3.

In some embodiments, a first arrival time interval D1d between the first sub-laser beam MLB1 and the second sub-laser beam MLB2 is greater than a second arrival time interval D2d between the second sub-laser beam MLB2 and the third sub-laser beam MLB3. For example, the first arrival time interval D1d is in a range of about 0.5 μs to about 2 μs, and the second arrival time interval D2d is in a range of about 0.3 μs to about 1.5 μs.

Two adjacent sub-laser beams of the first to third sub-laser beams MLB1, MLB2, MLB3 in the multiple pulse laser beam MLB partially overlap each other. For example, the first sub-laser beam MLB1 and the second sub-laser beam MLB2 partially overlap each other, and the second sub-laser beam MLB2 and the third sub-laser beam MLB3 partially overlap each other. For example, a pulse width of each of the first sub-laser beam MLB1, the second sub-laser beam MLB2, and the third sub-laser beam MLB3 is greater than each of the first arrival time interval D1d and the second arrival time interval D2d.

Figure 3:
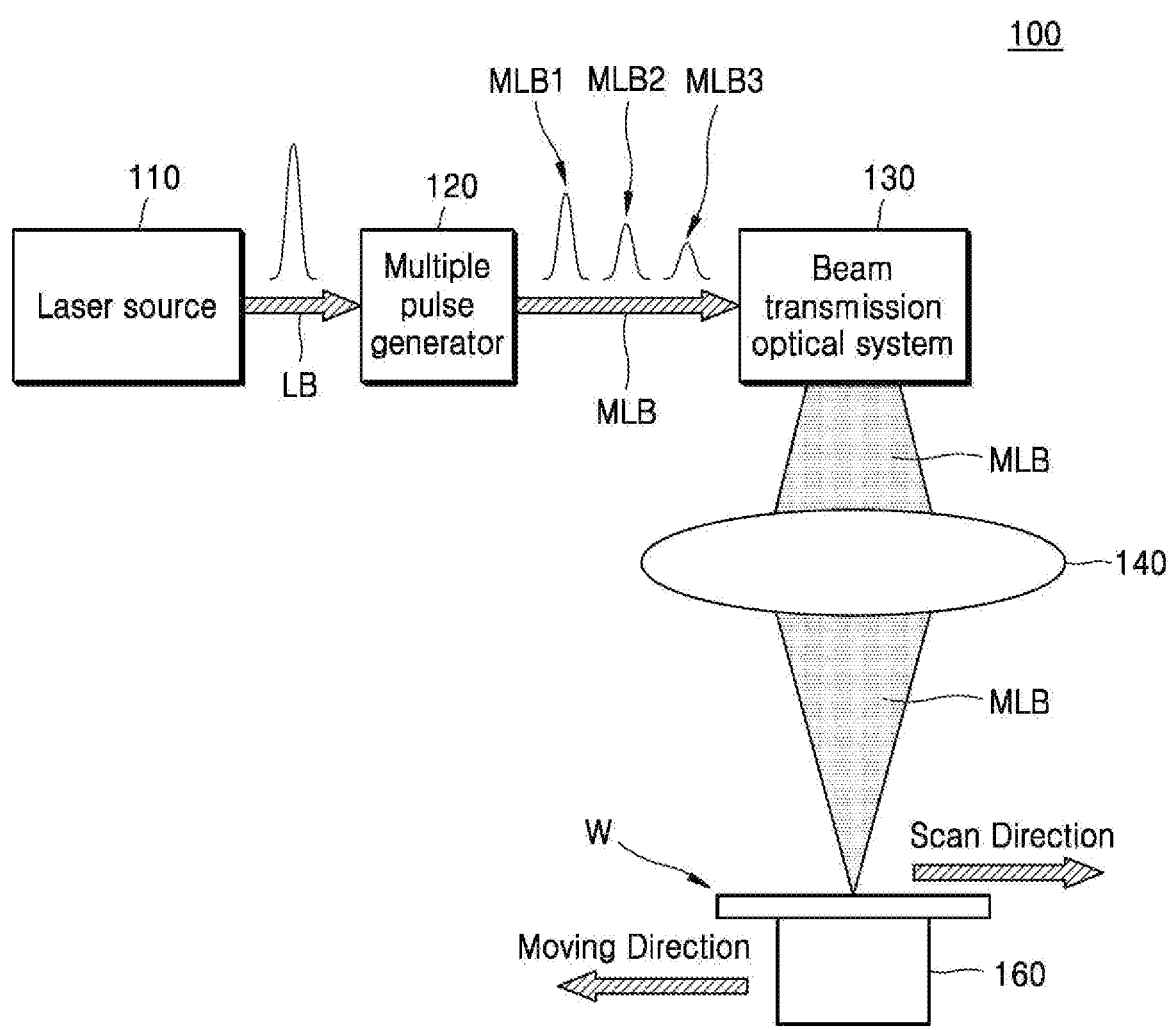
FIG. 3 illustrates a wafer processing device that performs a wafer dicing process, according to embodiments.

FIG. 3 illustrates a wafer processing device that performs a wafer dicing process, according to embodiments.

Referring to FIG. 3, in an embodiment, the wafer processing device 100 includes a laser source 110, a multiple pulse generator 120, a beam transmission optical system 130, a focusing lens optical system 140, and a wafer support 160. The wafer processing device 100 performs a stealth dicing process.

In some embodiments, the laser source 110 is a MOPA laser. The laser source 110 repeatedly outputs a laser beam LB at substantially constant time intervals. The laser beam LB output by the laser source 110 propagates to the multiple pulse generator 120. The multiple pulse generator 120 divides and delays the laser beam LB and generates a multiple pulse laser beam MLB that includes a plurality of sub-laser beams MLB1, MLB2, and MLB3. The multiple pulse generator 120 repeatedly generates the multiple pulse laser beam MLB and transmits the multiple pulse laser beam MLB to the beam transmission optical system 130.

The multiple pulse laser beam MLB transmitted by the multiple pulse generator 120 is transmitted by the beam transmission optical system 130 to the focusing lens optical system 140. The focusing lens optical system 140 focuses the multiple pulse laser beam MLB on a set position inside a wafer W.

The wafer support 160 supports the wafer W while the wafer W is being processed. The wafer support 160 can move the wafer W in a lateral direction such that the plurality of sub-laser beams MLB1, MLB2, and MLB3 in the multiple pulse laser beam MLB are respectively focused on different portions inside the wafer W. As a result, while the wafer W is being scanned along a scribe lane formed in the wafer W, cracks can form in different portions inside the wafer W. For example, a direction in which the wafer support 160 moves is opposite to a direction in which the multiple pulse laser beam MLB is scanned.

Figure 4:
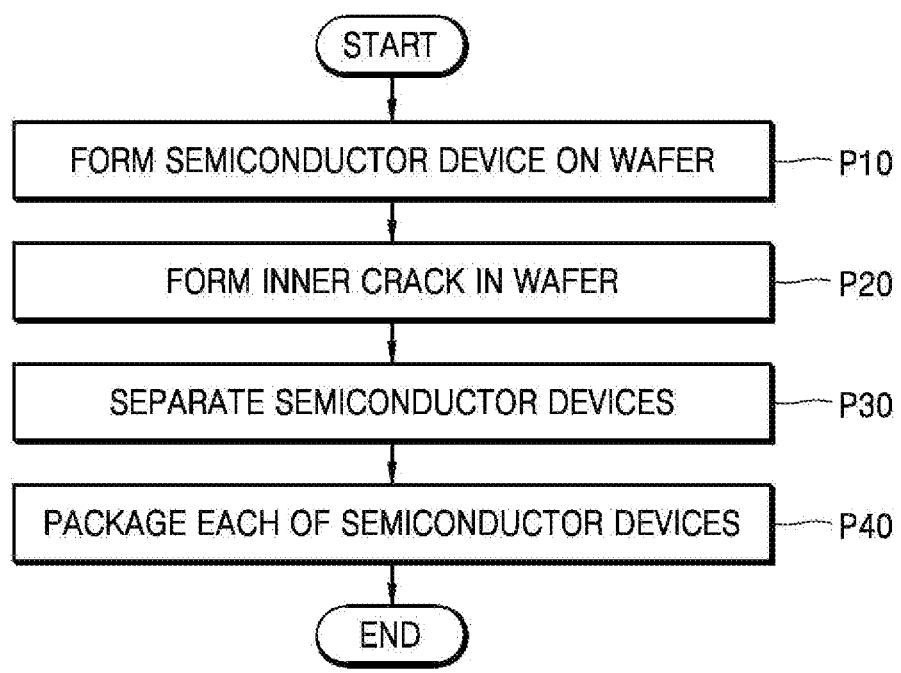
FIG. 4 is a flowchart of a method of manufacturing a semiconductor device, according to embodiments.

FIG. 4 is a flowchart of a method of manufacturing a semiconductor device, according to embodiments.

Figure 5A:
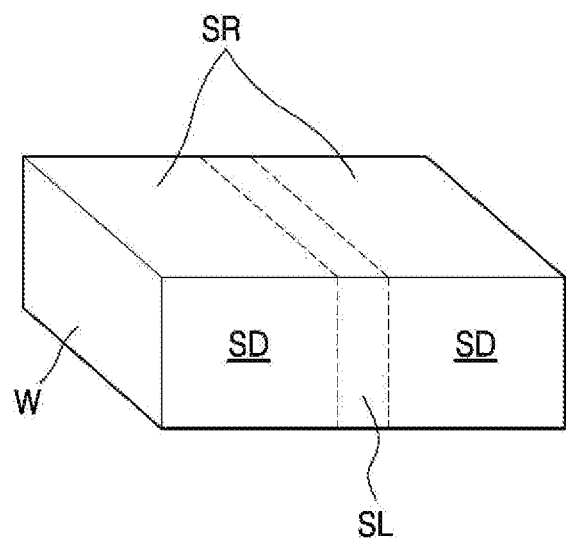
FIGS. 5A to 5C illustrate a method of manufacturing a semiconductor device, according to embodiments.
Figure 5B:
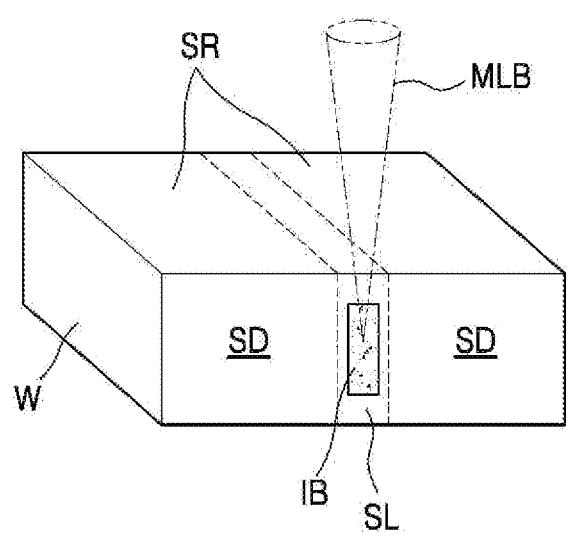
Figure 5C:
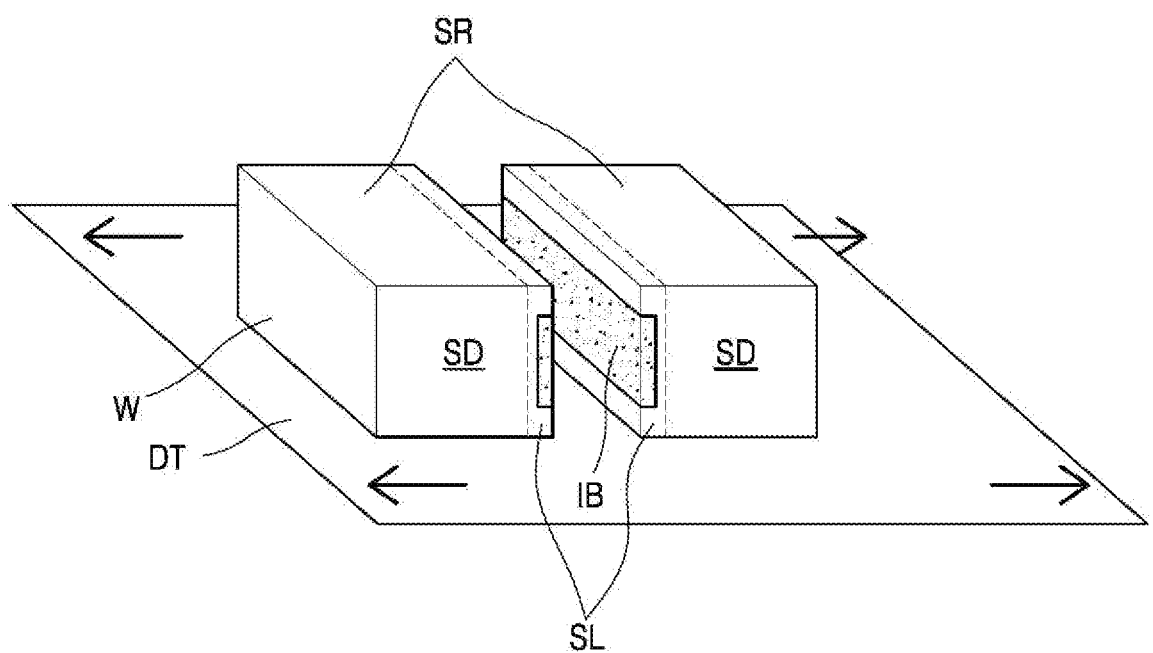
Figure 6A:
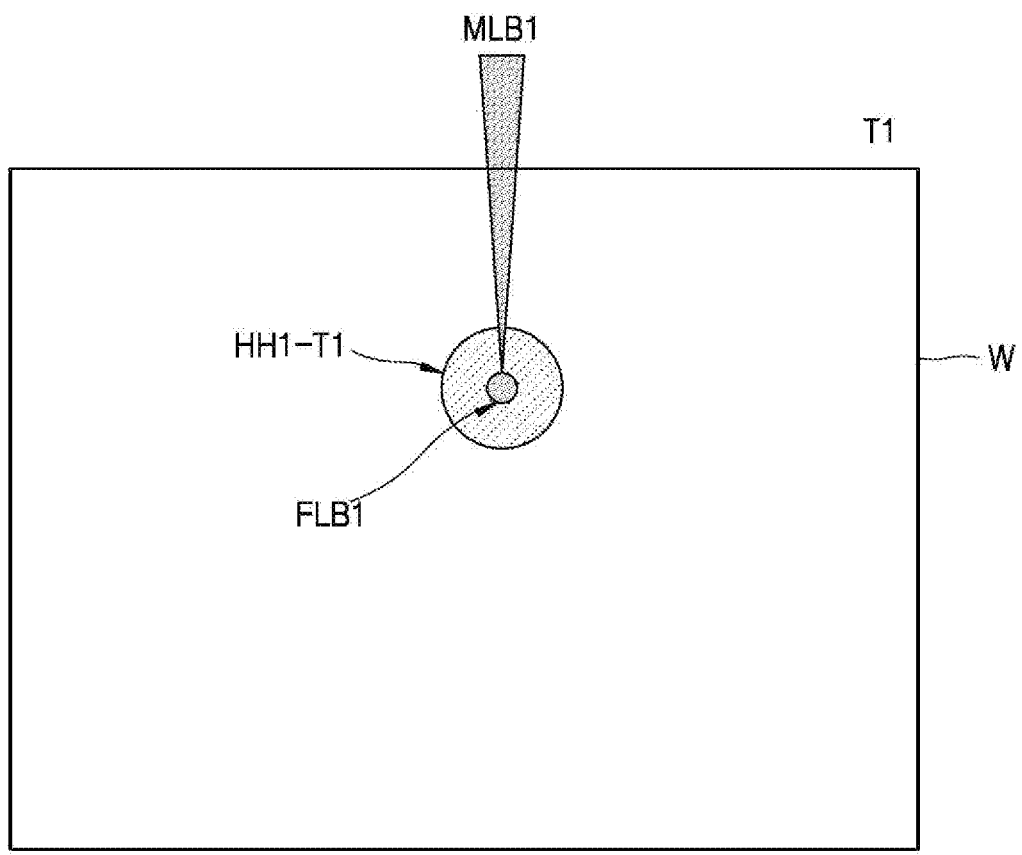
FIGS. 6A to 6D illustrate a wafer dicing method according to embodiments.
Figure 6B:
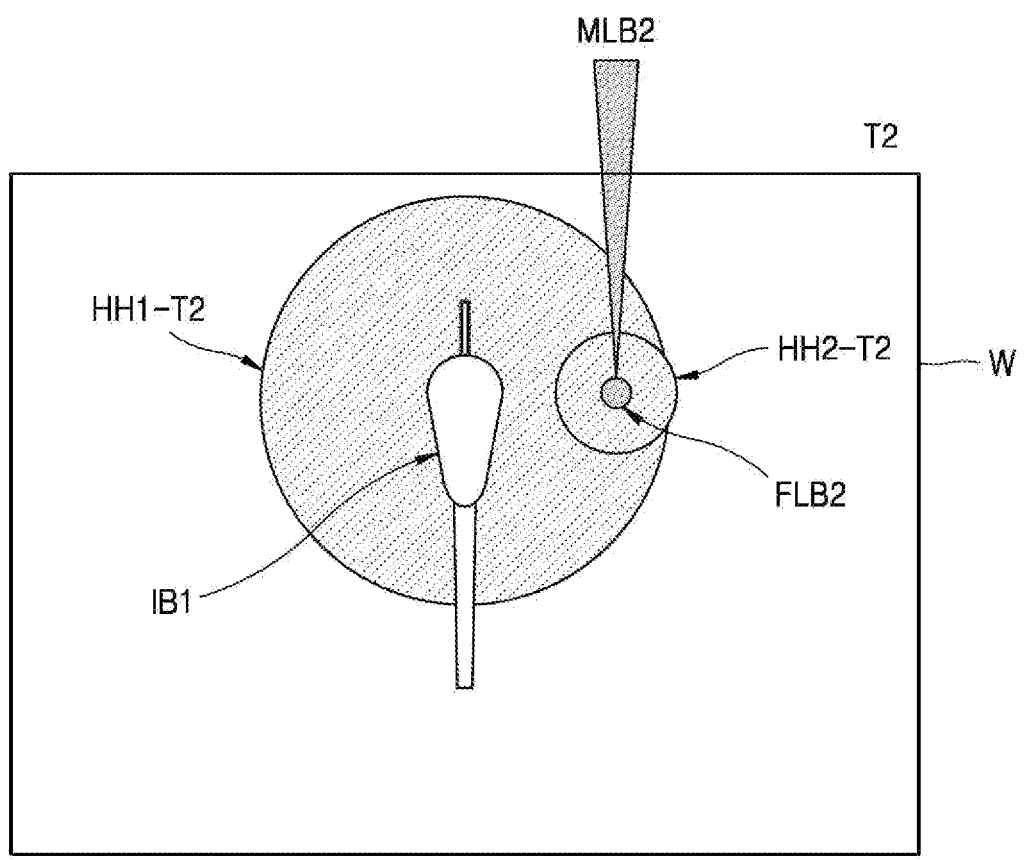
Figure 6C:
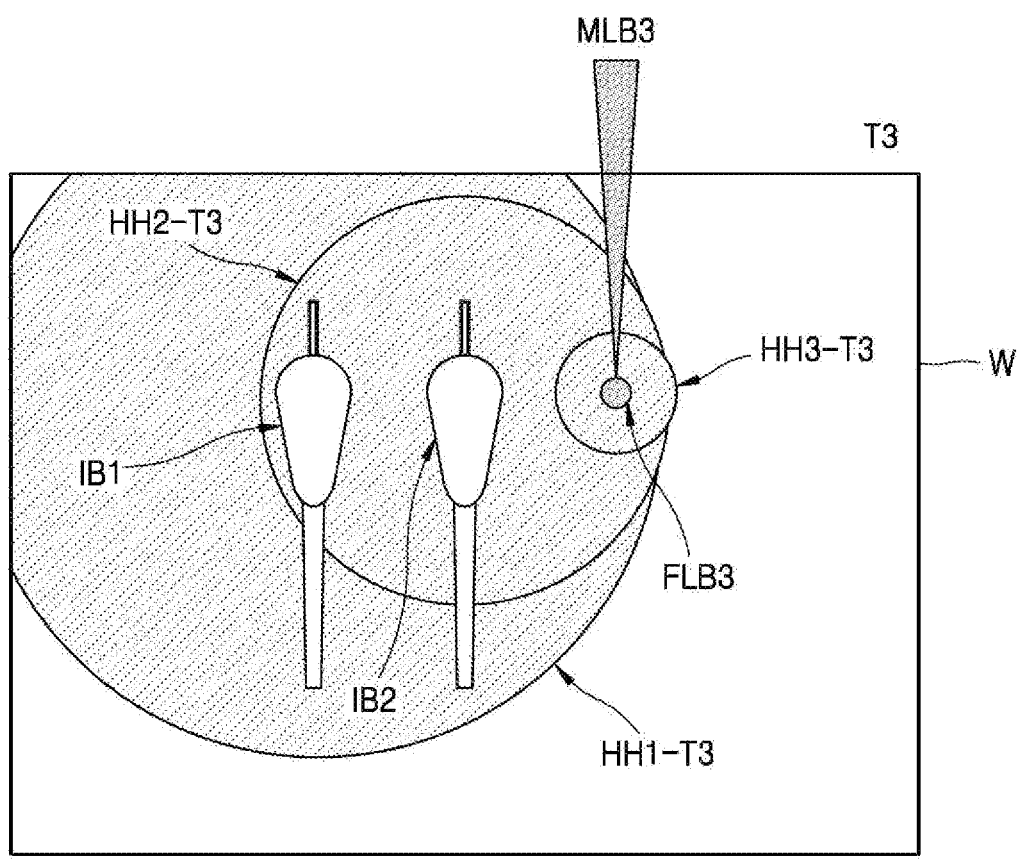
Figure 6D:
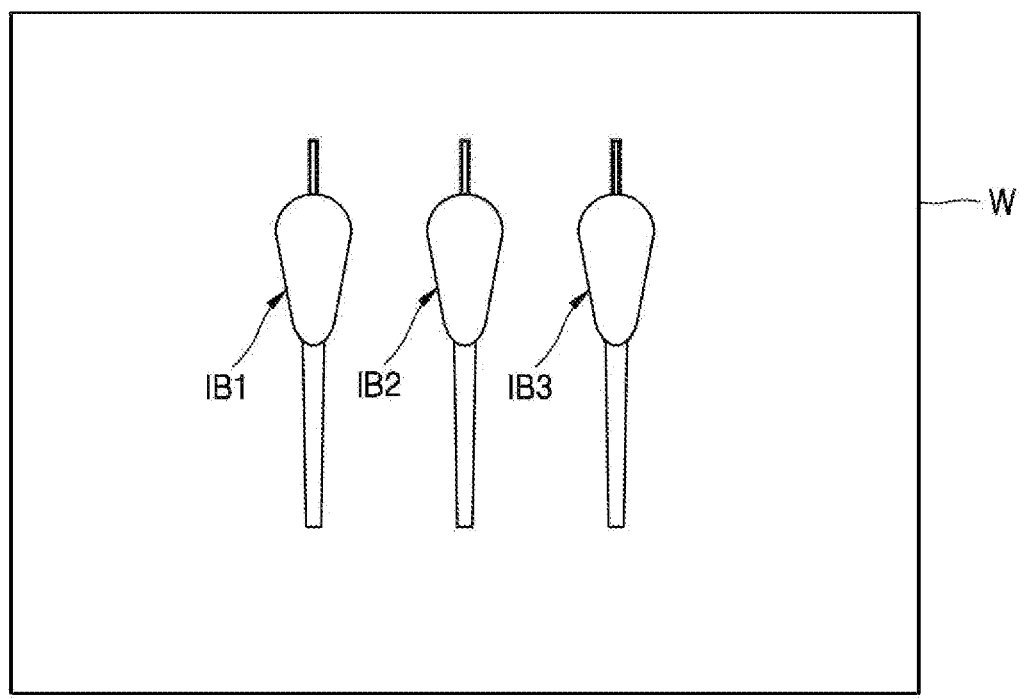

FIGS. 5A to 5C illustrate a method of manufacturing a semiconductor device, according to embodiments.

Referring to FIGS. 4 and 5A, in an embodiment, a plurality of semiconductor devices SD are formed on a wafer W (P10). The wafer W includes a plurality of device forming regions SR in which the plurality of semiconductor devices SD are respectively formed, and a scribe lane region SL that separates the plurality of device forming regions SR.

The wafer W may include, for example, silicon (Si). The wafer W may include a semiconductor element, such as germanium (Ge), or a compound semiconductor, such as at least one of silicon carbide (SiC), gallium arsenide (GaAs), indium arsenide (InAs), or indium phosphide (InP).

In some embodiments, the wafer W has a silicon-on-insulator (SOI) structure. The wafer W includes a buried oxide layer formed on a front surface of the wafer W. In some embodiments, the wafer W includes a conductive region, such as a doped well, formed on the front surface of the wafer W. In some embodiments, the wafer W has various device isolation structures, such as shallow trench isolation (STI) structures, that isolate doped wells from each other. In addition, a plurality of material layers are formed on a front surface of the wafer W. At least one material layer is formed on a rear surface of the wafer W.

The semiconductor device SD formed in the wafer W includes one of a memory device or a non-memory device. In some embodiments, the memory device includes a non-volatile memory semiconductor device, such as one of a flash memory, a phase-change random access memory (PRAM), a magnetoresistive RAM (MRAM), a ferroelectric RAM (FeRAM), or a resistive RAM (RRAM). The flash memory may include, for example, a V-NAND flash memory. In some embodiments, the memory device includes a volatile memory semiconductor device, such as one of a dynamic RAM (DRAM) or a static RAM (SRAM). The memory device may include volatile memory device that lose data when a power supply is interrupted. In some embodiments, the non-memory device includes a logic chip, such as one of a central processing unit (CPU), a graphics processing unit (GPU), or an application processor (AP). In some embodiments, the non-memory device includes one of a measuring device, a communication device, a digital signal processor (DSP), or a System-On-Chip (SOC).

A process of forming the semiconductor device SD includes an oxidation process that forms an oxide film, a lithography process that includes a spin coating process, an exposure process, and a developing process, a thin-film deposition process, a dry or wet etching process, and a metal wiring process.

The oxidation process forms a thin and uniform silicon oxide film by chemically reacting oxygen or water vapor with a surface of a silicon substrate at a high temperature of about 800° C. to about 1200° C. The oxidation process includes a dry oxidation process and a wet oxidation process. The dry oxidation process forms an oxide film by causing a reaction of the surface of the silicon substrate with oxygen gas, and the wet oxidation process forms an oxide film by reacting the surface of the silicon substrate with oxygen and water vapor.

In some embodiments, a silicon on insulator (SOI) structure is formed on a substrate by using an oxidation process. The substrate includes a buried oxide layer. In some embodiments, the substrate has various device isolation structures, such as a shallow trench isolation (STI) structure.

The lithography process transfers a circuit pattern previously formed in a lithography mask onto the substrate through the exposure process. The lithography process is performed in the order of the spin coating process, the exposure process, and the developing process.

The thin-film deposition process is, for example, one of an atomic layer deposition (ALD) process, a chemical vapor deposition (CVD) process, a plasma-enhanced CVD (PECVD) process, a metal organic CVD (MOCVD) process, a physical vapor deposition (PVD) process, a reactive pulsed laser deposition process, a molecular beam epitaxy (MBE) process, or a direct-current (DC) magnetron sputtering process.

The dry etching process is, for example, one of a reactive ion etching (RIE) process, a deep RIE (DRIE) process, an ion beam etching (IBE) process, or an argon (Ar) milling process. In an embodiment, the dry etching process performed on the wafer W is an atomic layer etching (ALE) process. In addition, the dry etching process performed on the wafer W uses at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, or COS as an etchant gas.

The metal wiring process forms a conductive wiring (or a metal wiring) that embodies a circuit pattern for an operation of the semiconductor device SD. Due to the metal wiring process, transmission paths of ground, power, and signals that operate the semiconductor device SD are formed. The metal wiring includes at least one metal element of gold (Au), platinum (Pt), silver (Ag), copper (Cu), aluminum (Al), titanium (Ti), tantalum (Ta), or tungsten (W).

In some embodiments, in a process of forming the semiconductor device SD, a planarization process, such as a chemical mechanical polish (CMP) process or an etchback process or an ion implantation process, are performed.

Referring to FIGS. 4 and 5B together, in an embodiment, an inner crack IB is formed in the wafer W (P20). The inner crack IB is formed in a scribe lane region SL.

The inner crack IB in the wafer W is formed by a multiple pulse laser beam MLB that is output by one of the wafer processing devices 100, 100a, 102, and 102a shown in FIGS. 1 to 12.

In some embodiments, before the inner crack IB in the wafer W is formed, to reduce a thickness of the wafer W, a pre-grinding process is performed on the rear surface of the wafer W, such as a surface opposite to the front surface of the wafer W on which the semiconductor device SD is formed.

Referring to FIGS. 4 and 5C together, in an embodiment, the semiconductor devices SD are separated from each other (P30).

The wafer W in which the inner crack IB is formed is adhered to a dicing tape DT, and then the semiconductor devices SD are separated from each other along the inner crack IB by stretching the dicing tape DT in a lateral direction. In some embodiments, before the dicing tape DT is adhered to the wafer W, a back grinding process that polishes the rear surface of the wafer W is further performed.

The separated semiconductor devices SD are each packaged (P40). A packaging process includes a wire-bonding process, a molding process, a marking process, and a solder-ball mount process.

FIGS. 6A to 6D illustrate a wafer dicing method according to embodiments.

Referring to FIGS. 6A to 6D together, in an embodiment, a first sub-laser beam MLB1 is irradiated into a wafer W at a first time point T1. The first sub-laser beam MLB1 is focused and irradiated on a first beam focal point FLB1 in the wafer W. A first inner crack IB1 is formed by the first beam focal point FLB1. The first beam focal point FLB1 is located in a scribe lane region SL shown in FIGS. 5A to 5C.

Due to the first sub-laser beam MLB1 being irradiated on the first beam focal point FLB1 in the wafer W, parallel heat conduction occurs around the first beam focal point FLB1. A first parallel heat conduction region HH1-T1 is formed in which parallel heat conduction occurs due to the first sub-laser beam MLB1 at the first time point T1.

The second sub-laser beam MLB2 may be irradiated into the wafer W at the second time point T2. The second sub-laser beam MLB2 may be focused and irradiated on a second beam focal point FLB2 inside the wafer W. Due to the second sub-laser beam MLB2 being irradiated on the second beam focal point FLB2 in the wafer W, parallel heat conduction occurs around the second beam focal point FLB2. A second parallel heat conduction region HH1-T2 is formed in which parallel heat conduction occurs at the second time point T2. The second beam focal point FLB2 is located in the second parallel heat conduction region HH1-T2. As described with reference to FIGS. 1 to 3, because the second sub-laser beam MLB2 is formed by dividing and delaying a laser beam LB, the second sub-laser beam MLB2 is focused and irradiated on the second beam focal point FLB2 before a portion of the wafer W in which the second beam focus FLB2 is located is phase-changed. The second beam focal point FLB2 is located in the scribe lane region SL shown in FIGS. 5A to 5C. Because a temperature of the second beam focus FLB2 at the second time point T2 is higher than a temperature of the first beam focus FLB1 at the first time point T1, an absorptance of the wafer W for the second sub-laser beam MLB2 is higher than an absorptance of the wafer W for the first sub-laser beam MLB1, and the second parallel heat conduction region HH1-T2 becomes wider than a first parallel heat conduction region HH1-T1. Accordingly, even when a peak power of the second sub-laser beam MLB2 is less than a peak power of the first sub-laser beam MLB1, sufficient high-density defects can occur in the wafer W due to the second sub-laser beam MLB2. A second inner crack IB2 is formed from the second beam focal point FLB2.

The third sub-laser beam MLB3 is irradiated on the wafer W at the third time point T3. The third sub-laser beam MLB3 is focused and irradiated on a third beam focal point FLB3 in the wafer W. A fourth parallel heat conduction region HH2-T3 is formed in which parallel heat conduction occurs at a third time point T3, and a fifth parallel heat conduction region HH1-T3 is formed in which parallel heat conduction occurs due to the first sub-laser beam MLB1 at the third time point T3. The third beam focal point FLB3 is located in the fourth parallel heat conduction region HH2-T3 and the fifth parallel heat conduction region HH1-T5. As described with reference to FIGS. 1 to 3, because the third sub-laser beam MLB3 is formed by dividing and delaying a laser beam LB, the third sub-laser beam MLB3 is focused and irradiated on the third beam focal point FLB3 before a portion of the wafer W in which the third beam focal point FLB3 is located is phase-changed. The third beam focal point FLB3 is located in the scribe lane region SL shown in FIGS. 5A to 5C. Because a temperature of the third beam focal point FLB3 at the third time point T3 is higher than the temperature of the second beam focal point FLB2 at the second time point T2, an absorptance of the wafer W for the third sub-laser beam MLB3 is higher than the absorptance of the wafer W for the second sub-laser beam MLB2, and the fourth parallel heat conduction region HH2-T3 becomes wider than the third parallel heat conduction region HH2-T2. In addition, the fifth parallel heat conduction region HH1-T3 becomes wider than the second parallel heat conduction region HH1-T2. Accordingly, even when a peak power of the third sub-laser beam MLB3 is less than the peak power of the second sub-laser beam MLB2, sufficient high-density defects can occur in the wafer W due to the third sub-laser beam MLB3. A third inner crack IB3 is formed from the third beam focal point FLB3.

Due to the third sub-laser beam MLB3 being irradiated on the third beam focal point FLB3 in the wafer W, parallel heat conduction occurs around the third beam focal point FLB3. At the third time point T3, a sixth parallel heat conduction region HH3-T3 is formed in which parallel heat conduction occurs due to the third sub-laser beam MLB3.

The second sub-laser beam MLB2 is focused and irradiated on the second beam focal point FLB2 before the portion of the wafer W at which the second beam focal point FLB2 is located is phase-changed, and the third sub-laser beam MLB3 is focused and irradiated on the third beam focal point FLB3 before the portion of the wafer W at which the third beam focal point FLB3 is located is phase-changed. Therefore, even when distances between the first beam focal point FLB1, the second beam focal point FLB2, and the third beam focal point FLB3 on which the first sub-laser beam MBL1, the second sub-laser beam MBL2, and the third sub-laser beam MBL3 are focused and irradiated are reduced, diffuse reflection light is not generated from the second sub-laser beam MBL2 and the third sub-laser beam MBL3.

The wafer W is cut along the first inner crack IB1, the second inner crack IB2, and the third inner crack IB3.

Figure 7A:
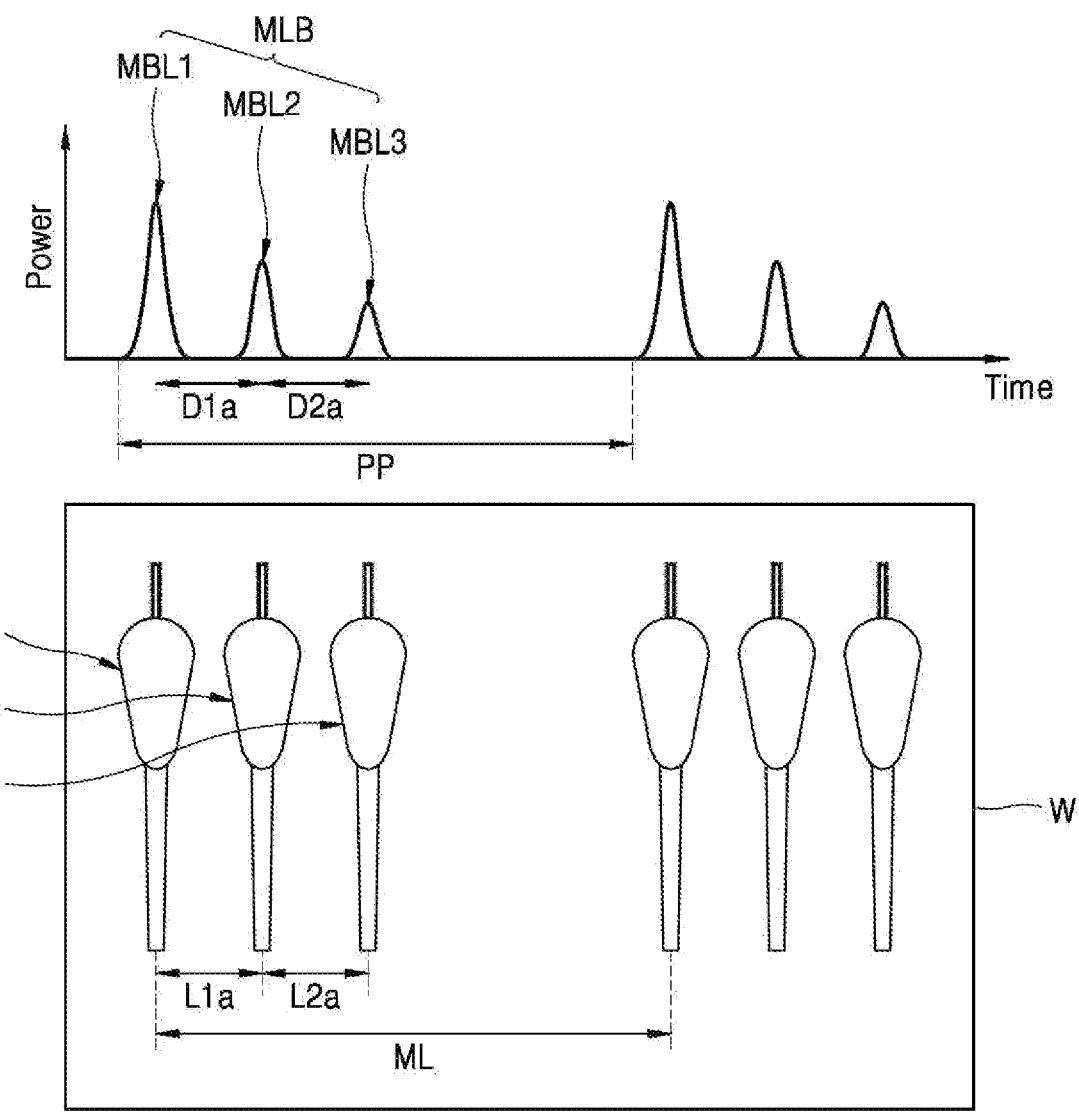
FIGS. 7A and 7B illustrate a wafer dicing method according to embodiments.
Figure 7B:
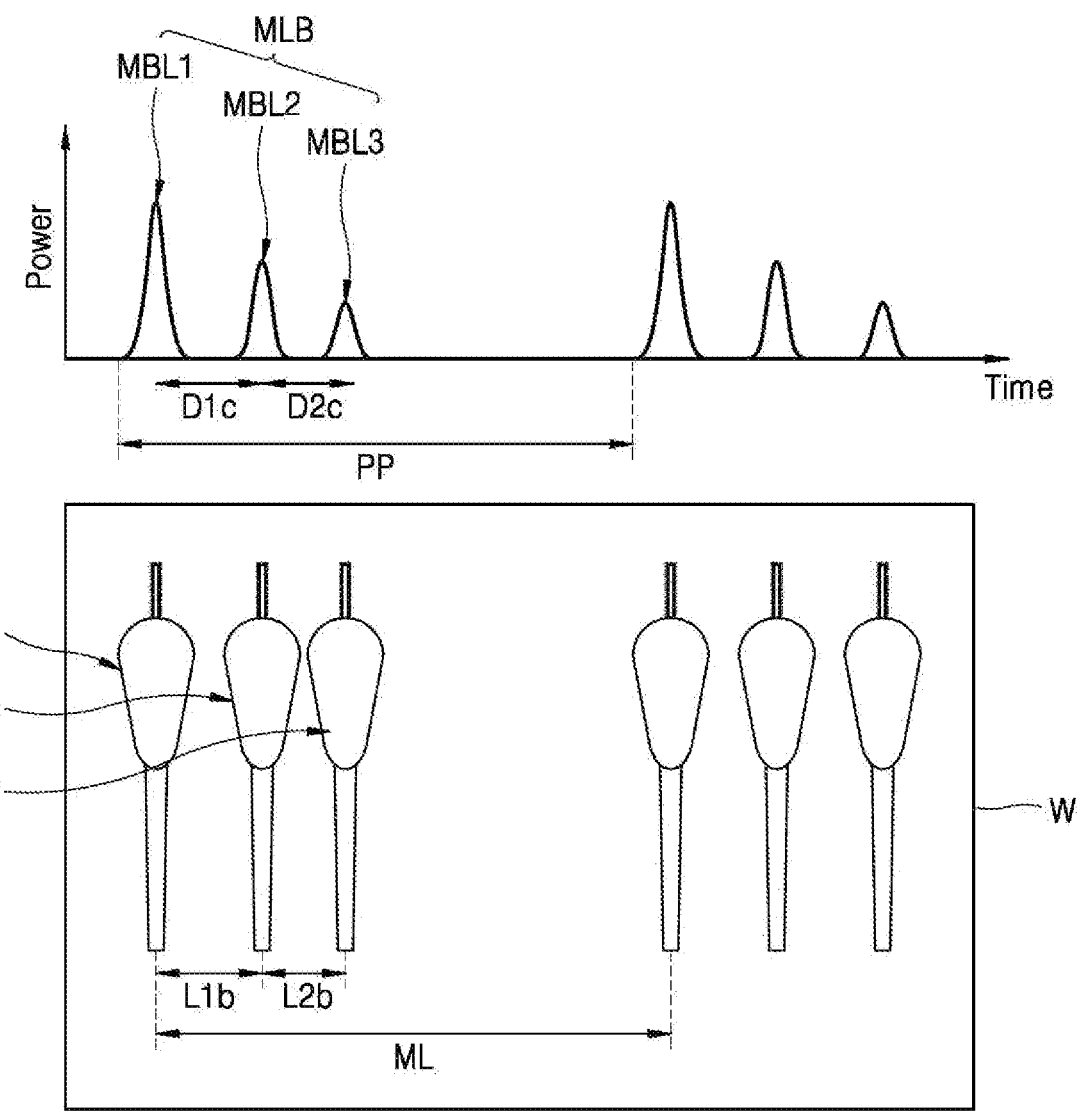

FIGS. 7A and 7B illustrate a wafer dicing method according to embodiments.

Referring to FIG. 7A, in an embodiment, a multiple pulse laser beam MLB is repeatedly irradiated on a wafer W. The multiple pulse laser beam MLB is repeatedly irradiated on the wafer W with a pulse pitch PP. The pulse pitch PP is in a range of about 10 μs to about 30 μs. The multiple pulse laser beam MLB includes a plurality of sub-laser beams MLB1, MLB2, and MLB3 that have gradually reduced peak powers and arrive at constant time intervals. For example, the multiple pulse laser beam MLB includes a first sub-laser beam MLB1, a second sub-laser beam MLB2, and a third sub-laser beam MLB3.

The first sub-laser beam MLB1, the second sub-laser beam MLB2, and the third sub-laser beam MLB3 are sequentially irradiated to the wafer W. The first sub-laser beam MLB1 forms a first inner crack IB1 in the wafer W, the second sub-laser beam MLB2 forms a second inner crack IB2 in the wafer W, and the third sub-laser beam MLB3 forms a third inner crack IB3 in the wafer W.

In some embodiments, a first arrival time interval D1a between the first sub-laser beam MLB1 and the second sub-laser beam MLB2 is equal to a second arrival time interval D2a between the second sub-laser beam MLB2 and the third sub-laser beam MLB3. For example, each of the first arrival time interval D1a and the second delivery time interval D2a is in a range of about 0.5 μs to about 2 μs. Each of the first arrival time interval D1a and the second arrival time interval D2a is less than the pulse pitch PP.

The first inner crack IB1, the second inner crack IB2, and the third inner crack IB3 are spaced apart from each other in a lateral direction. In the lateral direction, the first inner crack IB1 is a first distance L1a from the second inner crack IB2, and the second inner crack IB is a second distance L2a from the third inner crack IB3. The first distance L1a is equal to the second distance L2a. Each of the first distance L1a and the second distance L2a is in a range of about 0.5 μm to about 2 μm.

The first inner crack IB1, the second inner crack IB2, and the third inner crack IB3 that are formed due to a first multiple pulse laser beam MLB, and the first inner crack IB1, the second inner crack IB2, and the third inner crack IB3 that are formed due to a next multiple pulse laser beam MLB, are repeatedly arranged with a repetition distance ML therebetween. For example, the first inner crack IB1 formed by the first multiple pulse laser beam MLB and the first inner crack IB1 formed by the next multiple pulse laser beam MLB are repeatedly arranged with the repetition distance ML therebetween. The second inner crack IB2 formed by the first multiple pulse laser beam MLB and the second inner crack IB2 formed by the next multiple pulse laser beam MLB are repeatedly arranged with the repetition distance ML therebetween. The third inner crack IB3 formed by the first multiple pulse laser beam MLB and the third inner crack IB3 formed by the next multiple pulse laser beam MLB adjacent thereto are repeatedly arranged with the repetition distance ML therebetween. The repetition distance ML is in a range of about 10 μm to about 30 μm.

Referring to FIG. 7B, in an embodiment, a multiple pulse laser beam MLB is repeatedly irradiated on a wafer W. The multiple pulse laser beam MLB is repeatedly irradiated on the wafer W at a pulse pitch PP.

The first sub-laser beam MLB1, the second sub-laser beam MLB2, and the third sub-laser beam MLB3 are sequentially irradiated to the wafer W. The first sub-laser beam MLB1 forms a first inner crack IB1 in the wafer W, the second sub-laser beam MLB2 forms a second inner crack IB2 in the wafer W, and the third sub-laser beam MLB3 forms a third inner crack IB3 in the wafer W.

A first arrival time interval D1c between the first sub-laser beam MLB1 and the second sub-laser beam MLB2 is greater than a second arrival time interval D2c between the second sub-laser beam MLB2 and the third sub-laser beam MLB3. For example, the first arrival time interval D1c is in a range of about 0.5 μs to about 2 μs, and the second arrival time interval D2c is in a range of about 0.3 μs to about 1.5 μs.

The first inner crack IB1, the second inner crack IB2, and the third inner crack IB3 are apart from each other in a lateral direction. In the lateral direction, the first inner crack IB1 is a first distance L1b from the second inner crack IB2, and the second inner crack IB is a second distance L2b from the third inner crack IB3. The first distance L1b is greater than the second distance L2b. The first distance L1b is in a range of about 0.5 μm to about 2 μm, and the first distance L2b is in a range of about 0.3 μm to about 1.5 μm.

The first inner crack IB1, the second inner crack IB2, and the third inner crack IB3 that are formed by a first multiple pulse laser beam MLB, and the first inner crack IB1, the second inner crack IB2, and the third inner crack IB3 that are formed by a next multiple pulse laser beam MLB are repeatedly arranged with a repetition distance ML therebetween.

Referring to FIGS. 3 to 7B, the wafer processing device 100 repeatedly irradiates the multiple pulse laser beam MLB on the wafer W and repeatedly forms the first inner crack IB1, the second inner crack IB2, and the third inner crack IB3 that are relatively close to each other. Accordingly, the reliability of a stealth dicing process that is performed on the wafer W in the wafer processing device 100 and a semiconductor-device manufacturing yield is increased.

In addition, because the first inner crack IB1, the second inner crack IB2, and the third inner crack IB3 are formed relatively close to each other, even when the repetition distance ML between the multiple pulse laser beams MLB is increased, the sawing quality of the wafer W processed by the wafer processing device 100 is ensured. Because part of the multiple pulse laser beam MLB is irradiated on a parallel heat conduction region in which a phase is not changed and has an increased absorptance, diffuse reflection light is not generated from the multiple pulse laser beam MLB. Therefore, diffuse reflection light is prevented from affecting a semiconductor device in the wafer W, thereby increasing the yield and reliability of the manufacture of the semiconductor device.

Figure 8A:
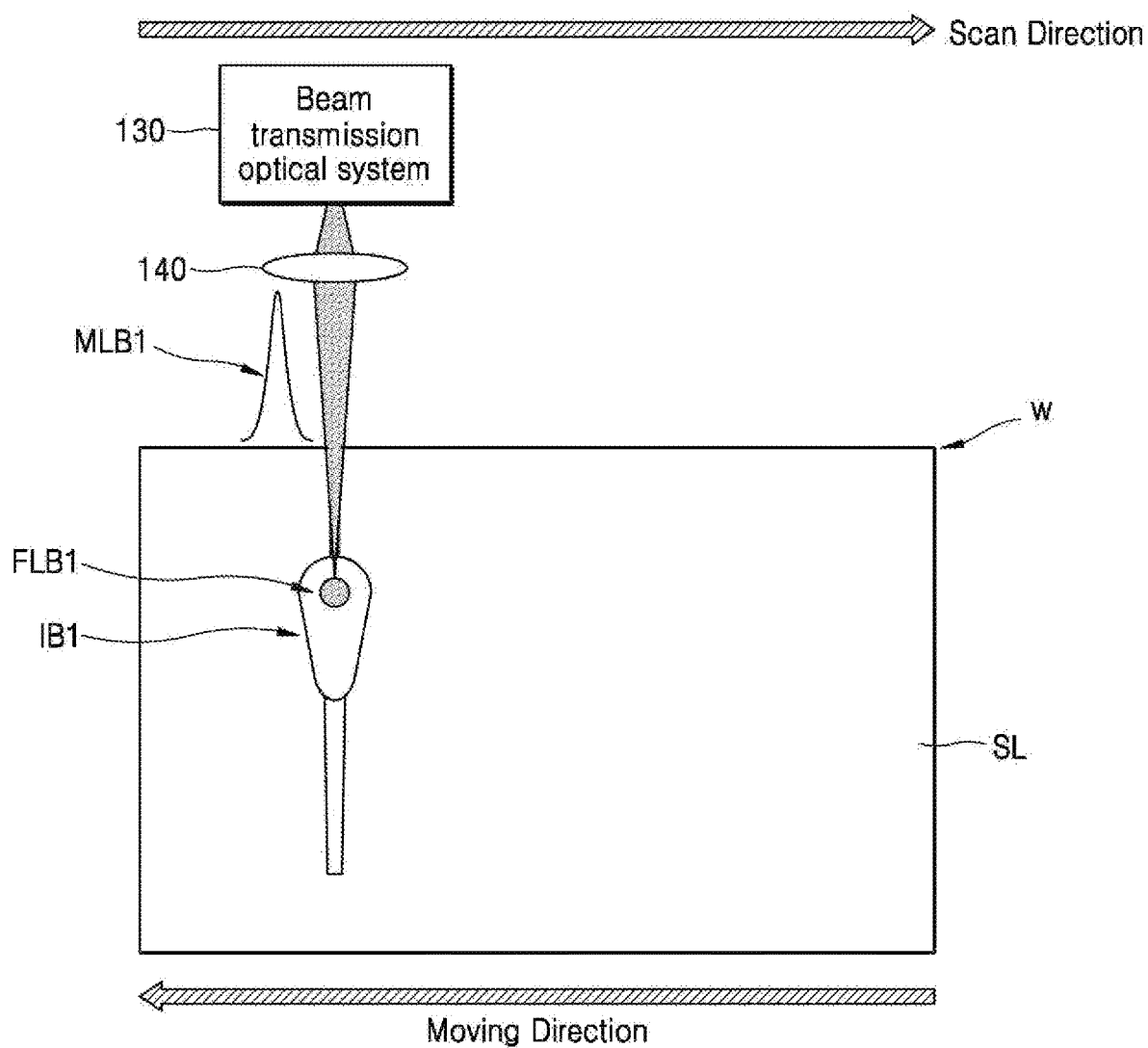
FIGS. 8A to 8C illustrate a wafer dicing method according to embodiments.
Figure 8B:
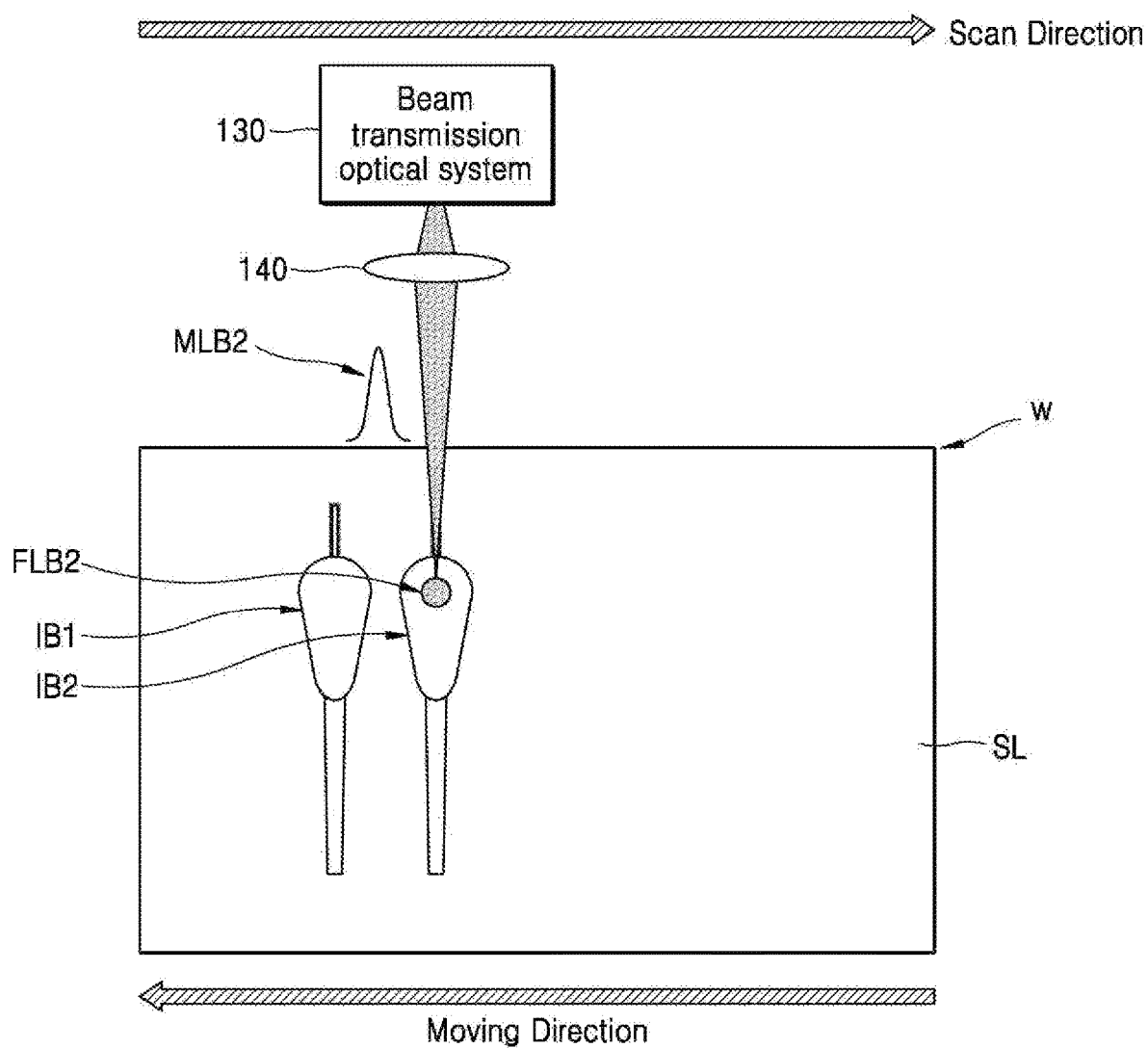
Figure 8C:
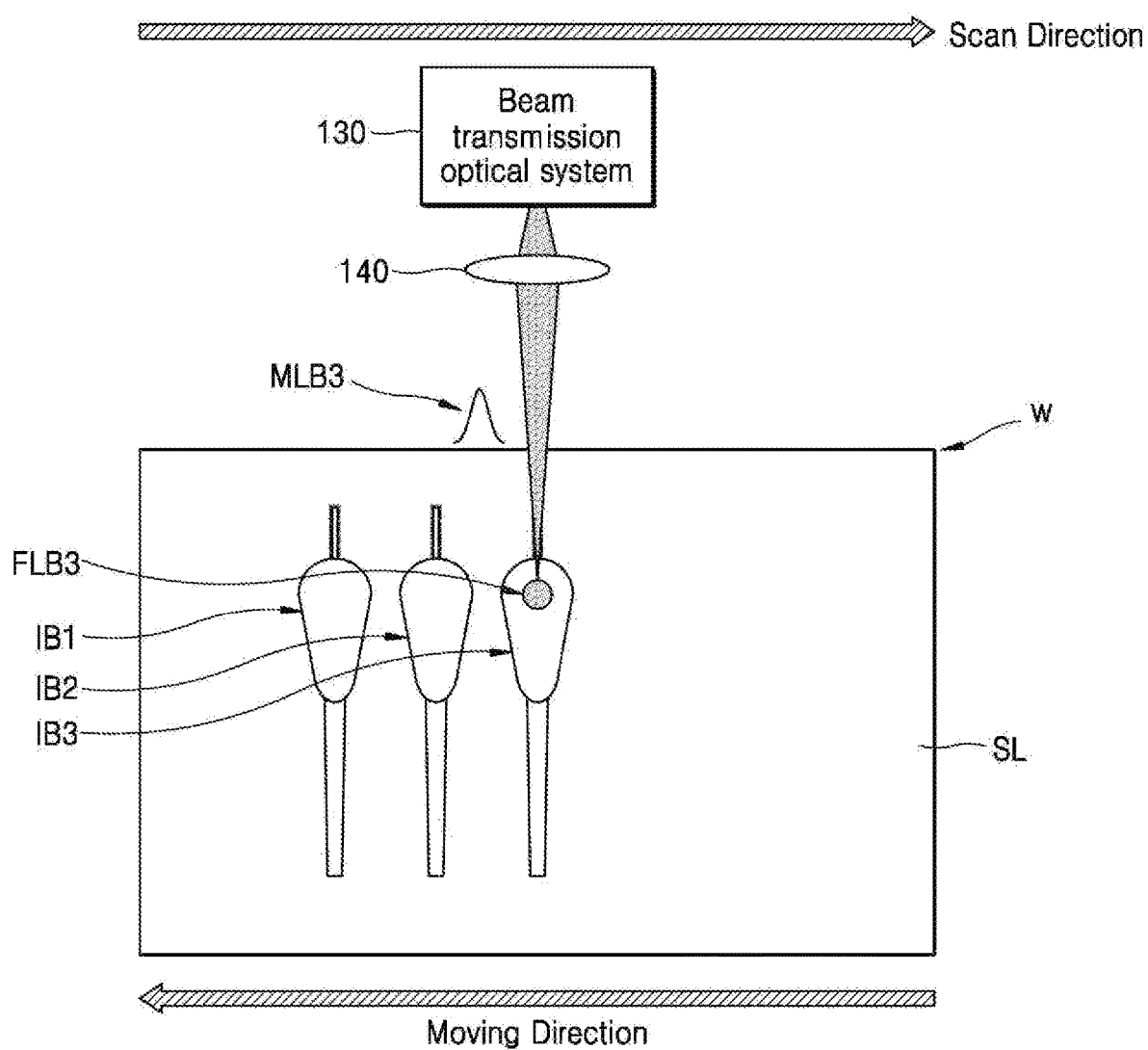

FIGS. 8A to 8C illustrate a wafer dicing method according to embodiments. For example, FIGS. 8A to 8C illustrate a wafer dicing method that is performed in the wafer processing device 100 described with reference to FIGS. 1A and 3.

Referring to FIGS. 8A to 8C together, in an embodiment, a first sub-laser beam MLB1 transmitted by the beam transmission optical system 130 to the focusing lens optical system 140 is focused on and irradiated to a first beam focal point FLB1 in a wafer W to form a first inner crack IB1.

A second sub-laser beam MLB2 transmitted by the beam transmission optical system 130 to the focusing lens optical system 140 is focused on and irradiated to a second beam focal point FLB2 in the wafer W to form a second inner crack IB2. The second beam focal point FLB2 is spaced apart from the first beam focal point FLB1 in a scan direction that is opposite to a moving direction of the wafer W.

A third sub-laser beam MLB3 transmitted by the beam transmission optical system 130 to the focusing lens optical system 140 is focused on and irradiated to a third beam focal point FLB3 in the wafer W to form a third inner crack IB3. The third beam focal point FLB3 is spaced apart from the second beam focal point FLB2 in the scan direction that is opposite to the moving direction of the wafer W.

The first inner crack IB1, the second inner crack IB2, and the third inner crack IB3 are formed in the scribe lane region SL of the wafer W. The first inner crack IB1 formed by the first sub-laser beam MLB1, the second inner crack IB2 formed by the second sub-laser beam MLB2, and the third inner crack IB3 formed by the third sub-laser beam MLB3 are spaced apart from each other in the scan direction.

Figure 9:
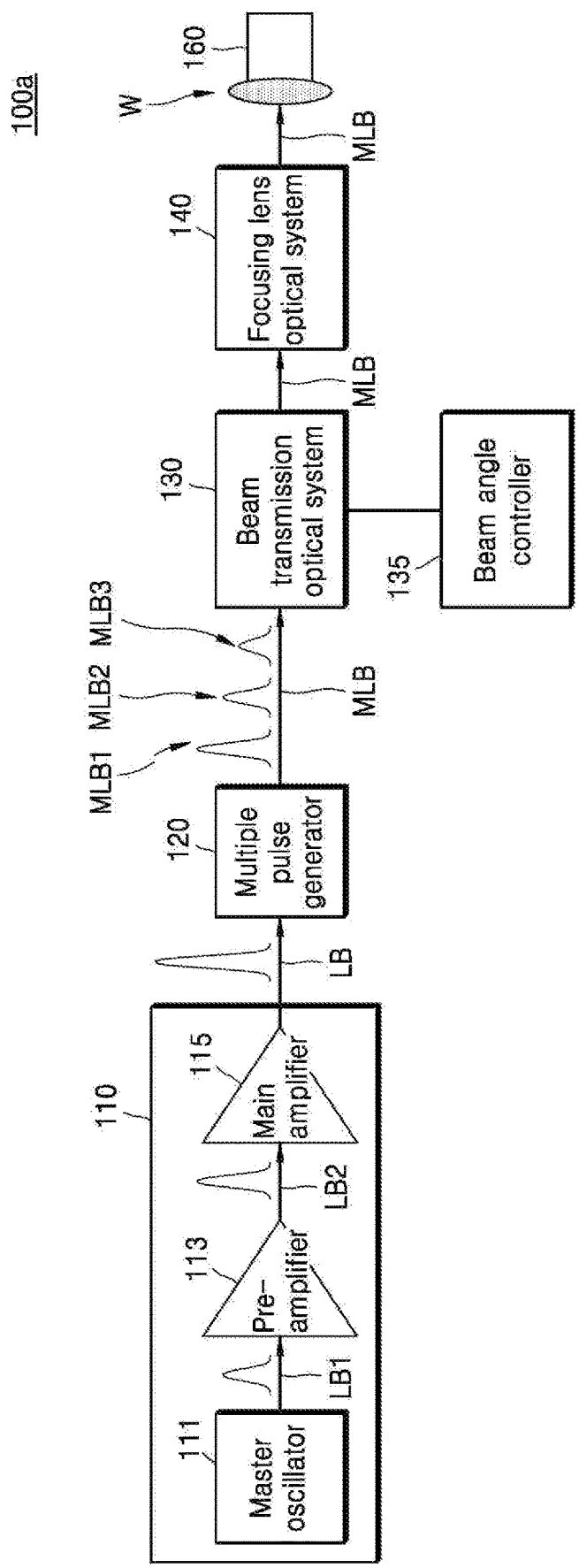
FIG. 9 is a block diagram of a wafer processing device that performs a wafer dicing process, according to embodiments.

FIG. 9 is a block diagram of a wafer processing device 100a that performs a wafer dicing process, according to embodiments. The same descriptions as those given with reference to FIGS. 1A and 1B are omitted from the descriptions of FIG. 9 for brevity, and differences between embodiments of FIGS. 9 and 1A and 1B are mainly described.

Referring to FIG. 9, in an embodiment, the wafer processing device 100a include a laser source 110, a multiple pulse generator 120, a beam transmission optical system 130, a beam angle controller 135, a focusing lens optical system 140, and a wafer support 160. The beam angle controller 135 controls the beam transmission optical system 130 to adjust a direction in which a multiple pulse laser beam MLB is irradiated.

Figure 10A:
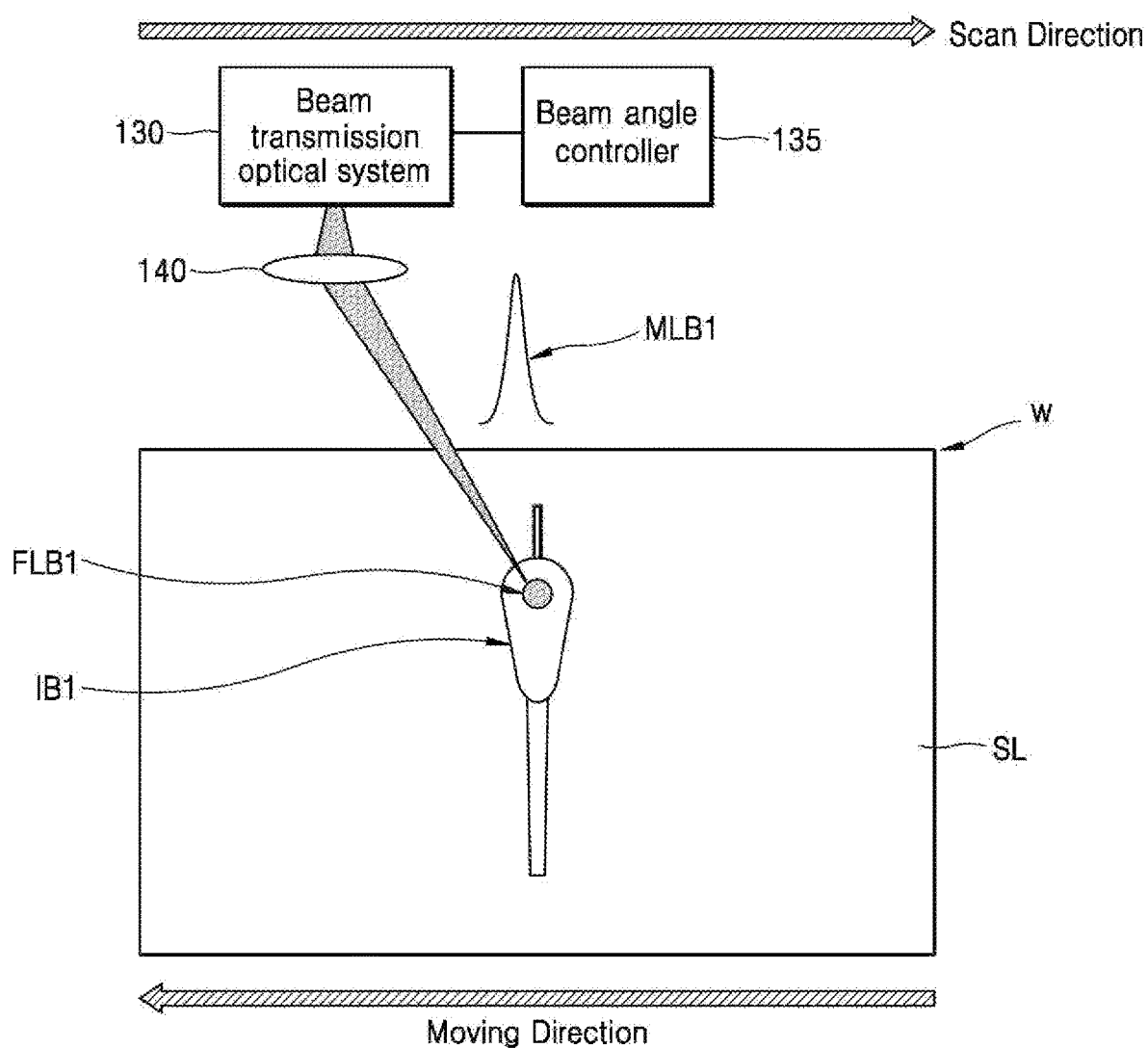
FIGS. 10A to 10C illustrate a wafer dicing method, according to embodiments.
Figure 10B:
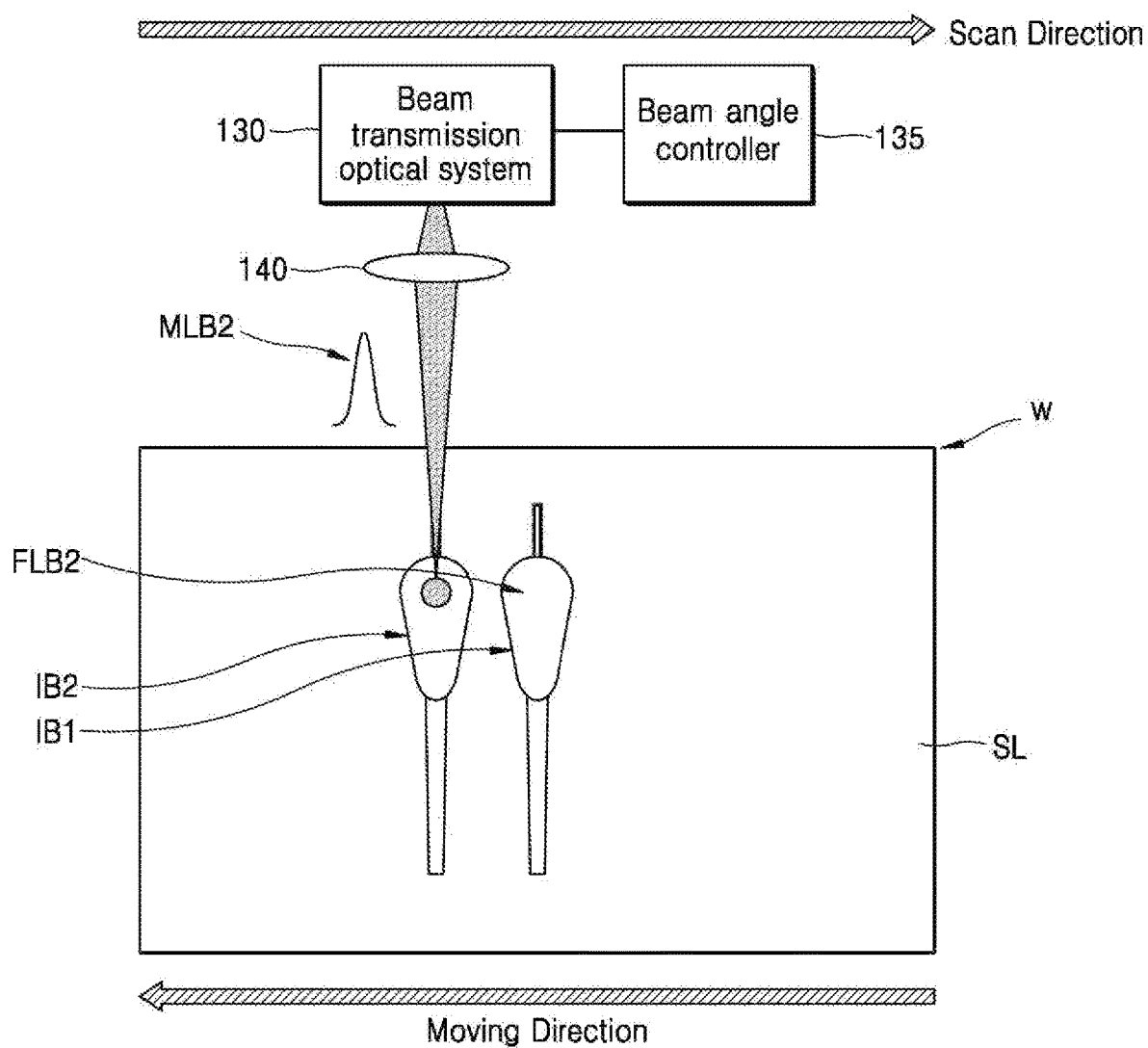
Figure 10C:
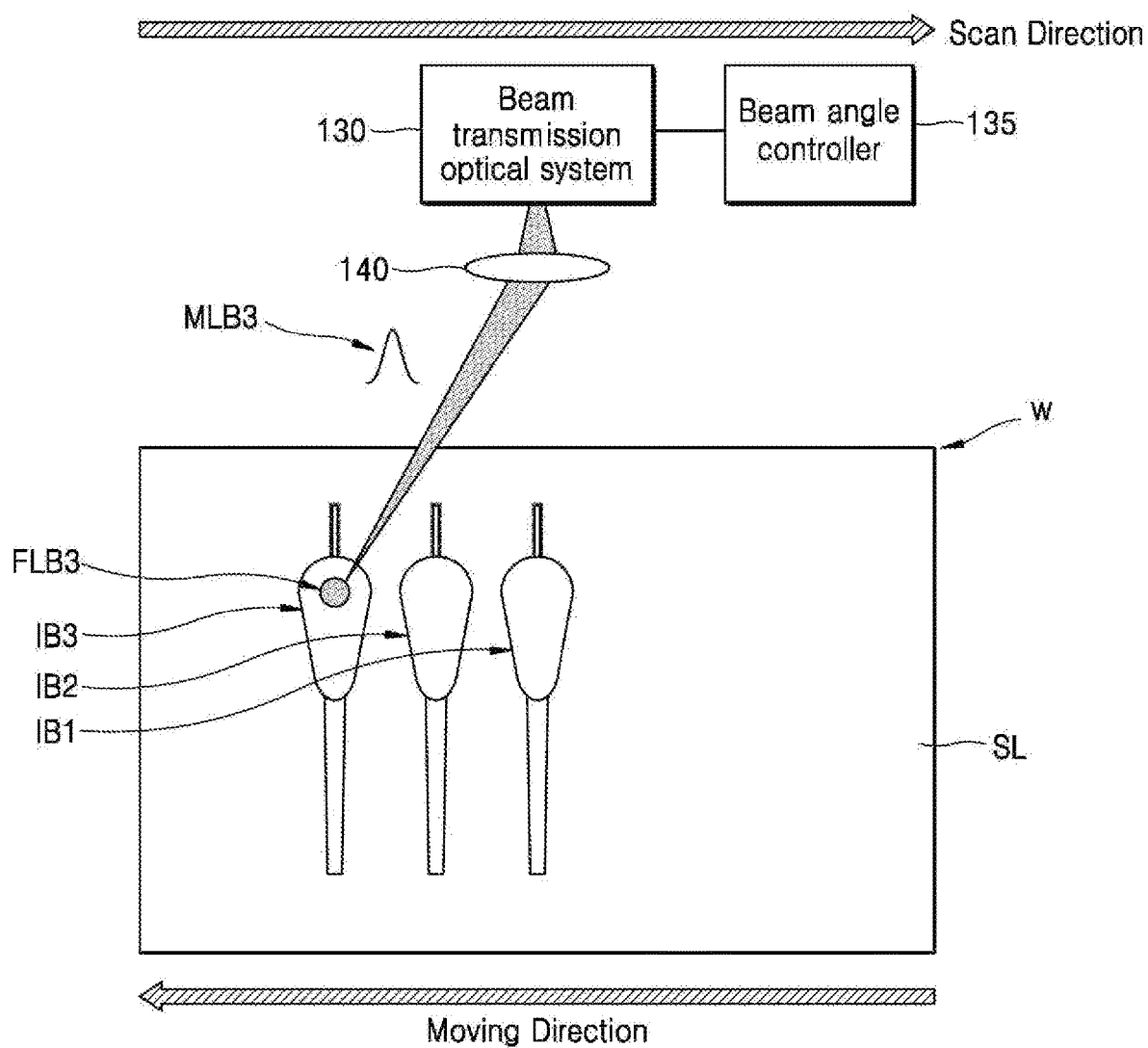

FIGS. 10A to 10C illustrate a wafer dicing method according to embodiments. For example, FIGS. 10A to 10C illustrate a wafer dicing method that is performed in the wafer processing device 100a described with reference to FIG. 9.

Referring to FIGS. 10A to 10C together, in an embodiment, a first sub-laser beam MLB1 that is transmitted by the beam transmission optical system 130 to the focusing lens optical system 140 is focused and irradiated on a first beam focal point FLB1 in a wafer W to form a first inner crack IB1. The beam angle controller 135 controls the beam transmission optical system 130 such that a direction in which the first sub-laser beam MLB1 is irradiated is adjusted from a vertical direction to a scan direction.

The second sub-laser beam MLB2 that is transmitted by the beam transmission optical system 130 to the focusing lens optical system 140 is focused and irradiated on the second beam focal point FLB2 in the wafer W to form a second inner crack IB2. The beam angle controller 135 controls the beam transmission optical system 130 such that a direction in which the second sub-laser beam MLB2 is irradiated is less toward the scan direction than the direction in which the first sub-laser beam MLB1 is irradiated. For example, the irradiation direction of the second sub-laser beam MLB2 is toward the vertical direction or more toward the vertical direction than the irradiation direction of the first sub-laser beam MLB1. The second beam focal point FLB2 is spaced apart from the first beam focal point FLB1 in a moving direction of the wafer W, which is opposite to the scan direction.

The third sub-laser beam MLB3 that is transmitted by the beam transmission optical system 130 to the focusing lens optical system 140 is focused and irradiated on the third beam focal point FLB3 in the wafer W to form a third inner crack IB3. The beam angle controller 135 controls the beam transmission optical system 130 such that an irradiation direction of the third sub-laser beam MLB3 is less toward the scan direction than the irradiation direction of the second sub-laser beam MLB2, that is, such that the irradiation direction of the third sub-laser beam MLB3 i is toward the direction in which the wafer W moves. For example, the beam angle controller 135 controls the beam transmission optical system 130 such that the irradiation direction of the third sub-laser beam MLB1 is adjusted from a vertical direction toward the moving direction of the wafer W. The third beam focal point FLB3 is spaced apart from the second beam focal point FLB2 in the moving direction of the wafer W, which is opposite to the scan direction.

The first inner crack IB1, the second inner crack IB2, and the third inner crack IB3 are formed in the scribe lane region SL of the wafer W. The first inner crack IB1 formed by the first sub-laser beam MLB1, the second inner crack IB2 formed by the second sub-laser beam MLB2, and the third inner crack IB3 formed by the third sub-laser beam MLB3 are spaced apart from each other in the moving direction of the wafer W, which is opposite to the scan direction.

Figure 11:
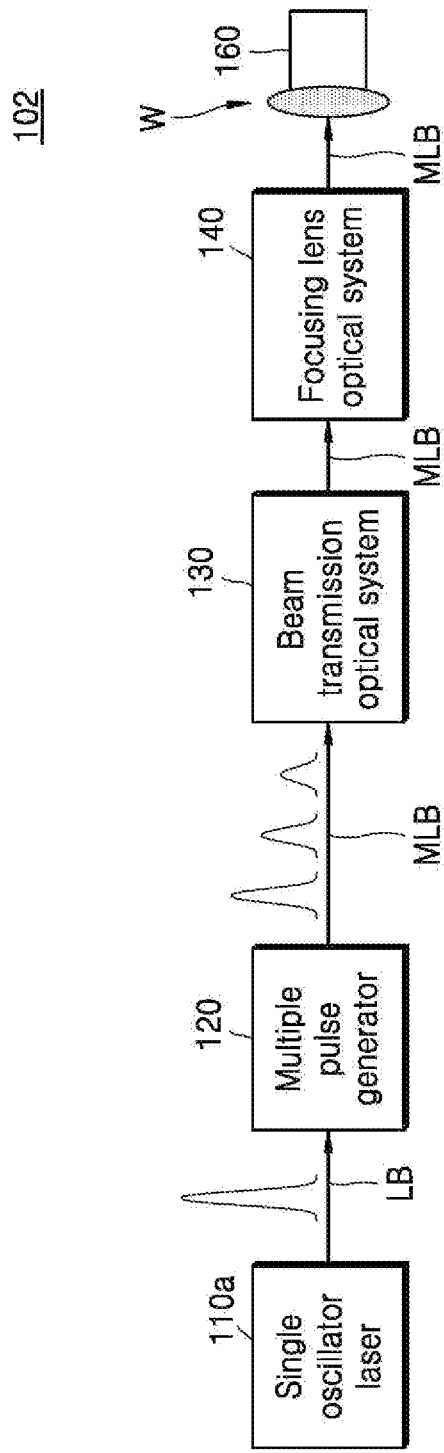
FIG. 11 is a block diagram of a wafer processing device that performs a wafer dicing process, according to embodiments.

FIG. 11 is a block diagram of a wafer processing device 102 that performs a wafer dicing process, according to embodiments. The same descriptions as those given with reference to FIGS. 1A and 1B are omitted from the descriptions of FIG. 11 for brevity, and differences between embodiments of FIGS. 11 and 1A and 1B are mainly described.

Referring to FIG. 11, in an embodiment, the wafer processing device 102 includes a single oscillator laser 110a, a multiple pulse generator 120, a beam transmission optical system 130, a focusing lens optical system 140, and a wafer support 160.

Unlike the wafer processing device 100 shown in FIGS. 1A and 1B, the wafer processing device 102 shown in FIG. 11 includes the single oscillator laser 110a. The single oscillator laser 110a outputs a laser beam LB having substantially the same time profile as that described with reference to FIGS. 1A and 1B.

Figure 12:
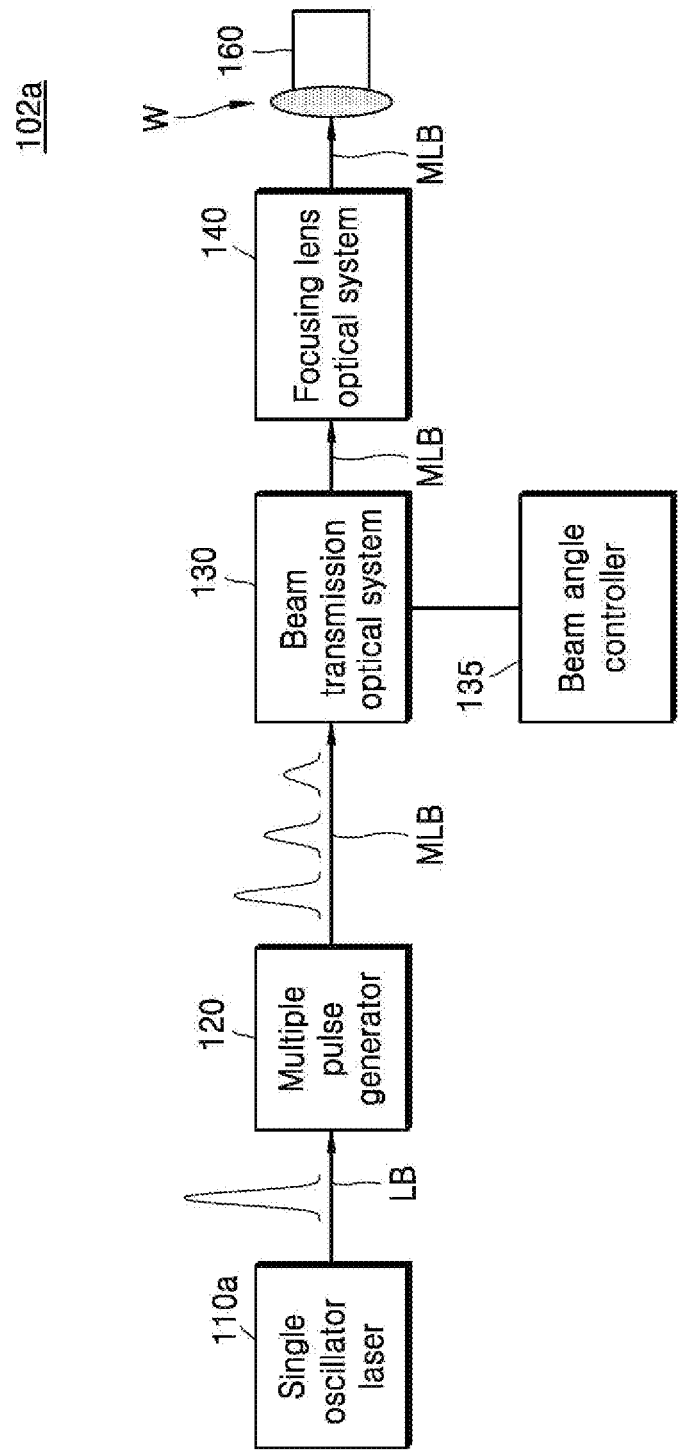
FIG. 12 is a block diagram of a wafer processing device that performs a wafer dicing process, according to embodiments.

FIG. 12 is a block diagram of a wafer processing device 102a that performs a wafer dicing process, according to embodiments. The same descriptions as those given with reference to FIGS. 1A, 1B, and 11 are omitted from the descriptions of FIG. 12 for brevity, and differences between embodiments of FIGS. 12 and 1A, 1B, and 11 are mainly described.

Referring to FIG. 12, in an embodiment, the wafer processing device 102a includes a single oscillator laser 110a, a multiple pulse generator 120, a beam transmission optical system 130, a beam angle controller 135, a focusing lens optical system 140, and a wafer support 160. The beam angle controller 135 controls the beam transmission optical system 130 to adjust a direction in which a multiple pulse laser beam MLB is irradiated.

While embodiments of the inventive concept have been particularly shown and described with reference to drawings thereof, it will be understood that various changes in form and details may be made therein without departing from the spirit and scope of the following claims.

What is claimed is:

1. A wafer dicing method, comprising:
preparing a wafer that includes a plurality of device forming regions and a scribe lane region that separates the plurality of device forming regions;
forming a plurality of semiconductor devices in the plurality of device forming regions of the wafer, respectively;
forming a plurality of inner cracks in the scribe lane region of the wafer by repeatedly irradiating a multiple pulse laser beam that includes a plurality of sub-laser beams along the scribe lane region, wherein the plurality of sub-laser beams have decreasing peak powers; and
separating the plurality of semiconductor devices from each other along the plurality of inner cracks.

2. The method of claim 1, wherein the plurality of sub-laser beams of the multiple pulse laser beam comprise a first sub-laser beam, a second sub-laser beam, and a third sub-laser beam that are respectively focused and irradiated on a first beam focal point, a second beam focal point, and a third beam focal point on the wafer at a first time point, a second time point, and a third time point, respectively, the second sub-laser beam is focused and irradiated on the second beam focal point due to the first sub-laser beam being focused and irradiated on the first beam focal point at the first time point, wherein the second beam focal point is located in a first parallel heat conduction region in which parallel heat conduction occurs around the first beam focal point at the second time point, and the third sub-laser beam is focused and irradiated on the third beam focal point due to the second sub-laser beam being focused and irradiated on the second beam focal point at the second time point, wherein the third beam focal point is located in a second parallel heat conduction region in which parallel heat conduction occurs around the second beam focal point at the third time point.

3. The method of claim 2, wherein the first beam focal point, the second beam focal point, and the third beam focal point are spaced apart from each other in a direction in which the multiple pulse laser beam is scanned.

4. The method of claim 2, wherein the first beam focal point, the second beam focal point, and the third beam focal point are spaced apart from each other in a direction opposite to a direction in which the multiple pulse laser beam is scanned.

5. The method of claim 2, wherein the first sub-laser beam, the second sub-laser beam, and the third sub-laser beam of the multiple pulse laser beam respectively form a first inner crack, a second inner crack, and a third inner crack, a first distance between the first inner crack and the second inner crack and a second distance between the second inner crack and the third inner crack are each in a range of about 0.3 µm to about 2 µm, and wherein the first sub-laser beams form a plurality of first inner cracks that have a repetition distance of about 10 µm to about 30 µm therebetween.

6. The method of claim 1, wherein the multiple pulse laser beam is repeatedly irradiated along the scribe lane region at intervals of about 10 µs to about 30 µs, and each arrival time interval between the plurality of sub-laser beams of the multiple pulse laser beam is in a range of about 0.3 µs to about 2 µs.

7. The method of claim 1, wherein arrival time intervals between the plurality of sub-laser beams of the multiple pulse laser beam are equal to each other.

8. The method of claim 1, wherein arrival time intervals between the plurality of sub-laser beams of the multiple pulse laser beam decrease.

9. The method of claim 1, wherein the plurality of sub-laser beams of the multiple pulse laser beam are separated from each other and do not overlap each other.

10. The method of claim 1, wherein two adjacent sub-laser beams of the plurality of sub-laser beams partially overlap each other.

11. A method of manufacturing a semiconductor device, the method comprising:

preparing a wafer that includes a plurality of device forming regions and a scribe lane region that separates the plurality of device forming regions;

forming a plurality of semiconductor devices in the plurality of device forming regions of the wafer, respectively;

forming a plurality of inner cracks by repeatedly irradiating a multiple pulse laser beam that includes a plurality of sub-laser beams at intervals of about 10 µs to about 30 µs, wherein the plurality of sub-laser beams have decreasing peak powers and an arrival time interval of about 0.3 µs is to about 2 µs therebetween, and the plurality of inner cracks are spaced apart from each other in a lateral direction in the wafer;

separating the plurality of semiconductor devices from each other along the plurality of inner cracks; and packaging each of the plurality of semiconductor devices, which are separated from each other.

12. The method of claim 11, wherein the plurality of sub-laser beams comprise a first sub-laser beam and a second sub-laser beam, wherein the first sub-laser beam and the second sub-laser beam are respectively focused and irradiated on a first beam focal point and a second beam focal point on the wafer at a first time point and a second time point, respectively, wherein the first time point and the second time point have an interval of about 0.3 µs to about 2 µs therebetween, wherein the second beam focal point is located in a parallel heat conduction region in which parallel heat conduction occurs around the first beam focal point due to first sub-laser beam.

13. The method of claim 12, wherein a peak power of the second sub-laser beam is about 50% to about 80% of a peak power of the first sub-laser beam.

14. The method of claim 12, wherein the second beam focal point is spaced apart from the first beam focal point in a scanning direction of the multiple pulse laser beam.

15. The method of claim 12, wherein the first beam focal point is spaced apart from the second beam focus in a scanning direction of the multiple pulse laser beam.

16. The method of claim 11, further comprising, before forming the plurality of inner cracks in the wafer, grinding a rear surface of the wafer.

17. The method of claim 11, further comprising, after forming the plurality of inner cracks in the wafer, grinding a rear surface of the wafer.

18. A method of manufacturing a semiconductor device, the method comprising:

preparing a wafer that includes a plurality of device forming regions and a scribe lane region that separates the plurality of device forming regions;

forming a plurality of semiconductor devices in the plurality of device forming regions of the wafer, respectively;

forming a first inner crack, a second inner crack, and a third inner crack by repeatedly irradiating a multiple pulse laser beam that includes a first sub-laser beam, a second sub-laser beam, and a third sub-laser beam at a pulse pitch greater than an arrival time interval between the first to third sub-laser beams, wherein the first to third sub-laser beams have the arrival time interval therebetween and have decreasing peak powers, and the first inner crack, the second inner crack, and the third inner crack are spaced apart from each other in a lateral direction in the wafer;

separating the plurality of semiconductor devices from each other along the first inner crack, the second inner crack, and the third inner crack; and packaging each of the plurality of semiconductor devices, which are separated from each other, wherein the second sub-laser beam is focused and irradiated on a second beam focal point, wherein the second beam focal point is located in a first parallel heat conduction region in which parallel heat conduction occurs around a first beam focal point due to the first sub-laser beam, and the third sub-laser beam is focused and irradiated on a third beam focal point, wherein the third beam focal point is located in a second parallel heat conductive region in which parallel heat conduction occurs around the second beam focal point due to the second sub-laser beam.

19. The method of claim 18, wherein the arrival time interval between the first sub-laser beam, the second sub-laser beam, and the third sub-laser beam is greater than a pulse width of each of the first sub-laser beam, the second sub-laser beam, and the third sub-laser beam, respectively, and less than or equal to five times the pulse width thereof.

20. The method of claim 18, wherein the pulse pitch is an interval of about 10 μs to about 30 μs, and the arrival time interval between the first sub-laser beam, the second sub-laser beam, and the third sub-laser beam is in a range of about 0.3 μs to about 2 μs.

* * * * *